United States Patent
Balasubramanian et al.

(10) Patent No.: US 10,530,397 B2
(45) Date of Patent: *Jan. 7, 2020

(54) BUTTERFLY NETWORK ON LOAD DATA RETURN

(71) Applicant: TEXAS INSTRUMENTS INCORPORATED, Dallas, TX (US)

(72) Inventors: Dheera Balasubramanian, Richardson, TX (US); Joseph Zbiciak, San Jose, CA (US); Duc Quang Bui, Grand Prairie, TX (US); Timothy David Anderson, University Park, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 14 days.

This patent is subject to a terminal disclaimer.

(21) Appl. No.: 15/651,055

(22) Filed: Jul. 17, 2017

(65) Prior Publication Data

US 2019/0020360 A1      Jan. 17, 2019

(51) Int. Cl.
  *H03M 13/00*   (2006.01)
  *H03M 13/27*   (2006.01)
  *G06F 9/38*    (2018.01)

(52) U.S. Cl.
  CPC ......... *H03M 13/6561* (2013.01); *G06F 9/38* (2013.01); *H03M 13/2789* (2013.01); *H03M 13/276* (2013.01)

(58) Field of Classification Search
  None
  See application file for complete search history.

(56) References Cited

U.S. PATENT DOCUMENTS

| | | | |
|---|---|---|---|
| 10,140,239 B1* | 11/2018 | Balasubramanian ... | G06F 13/42 |
| 2003/0002474 A1* | 1/2003 | Alexander ............. | H03M 9/00 370/351 |
| 2005/0080833 A1* | 4/2005 | Smith .................... | G06F 17/142 708/404 |
| 2007/0063732 A1* | 3/2007 | Kaptanoglu ....... | H03K 19/1737 326/40 |
| 2007/0288542 A1* | 12/2007 | Shih ...................... | G06F 17/142 708/404 |
| 2012/0166507 A1* | 6/2012 | Son ....................... | G06F 17/142 708/404 |
| 2013/0262945 A1* | 10/2013 | Saghi ............... | G01R 31/31705 714/744 |
| 2014/0129908 A1* | 5/2014 | Chowdhury ...... | H03M 13/4107 714/795 |
| 2016/0028396 A1* | 1/2016 | Gaillardon ......... | H03K 19/0013 326/38 |

* cited by examiner

*Primary Examiner* — Daniel F. McMahon
(74) *Attorney, Agent, or Firm* — Brian D. Graham; Charles A. Brill; Frank D. Cimino

(57) ABSTRACT

A method is shown that is operable to transform and align a plurality of fields from an input to an output data stream using a multilayer butterfly or inverse butterfly network. Many transformations are possible with such a network which may include separate control of each multiplexer. This invention supports a limited set of multiplexer control signals, which enables a similarly limited set of data transformations. This limited capability is offset by the reduced complexity of the multiplexor control circuits.

6 Claims, 21 Drawing Sheets

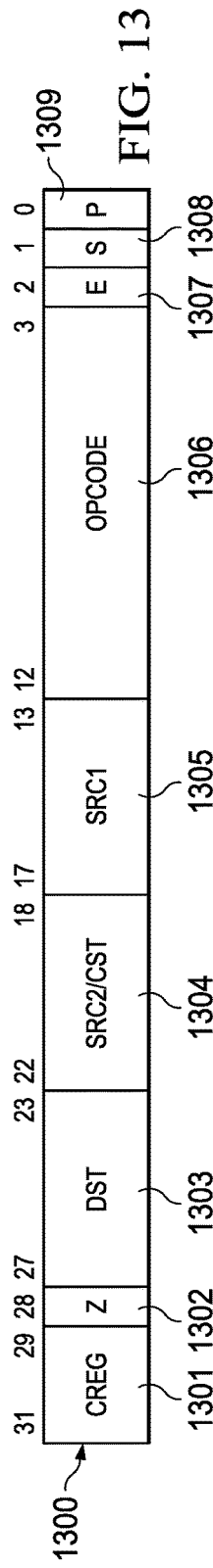
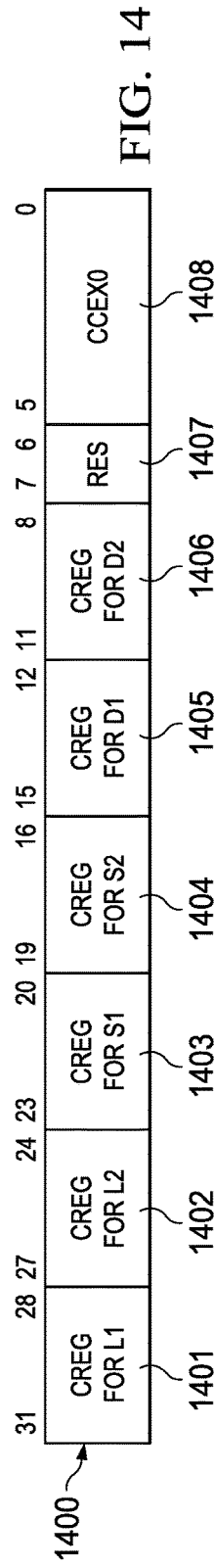
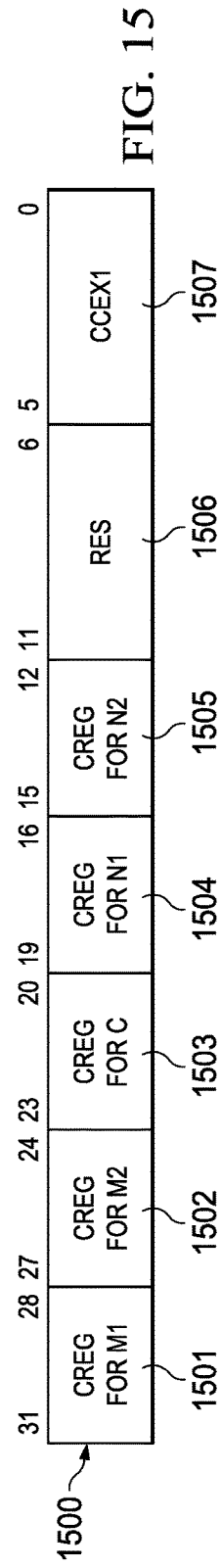
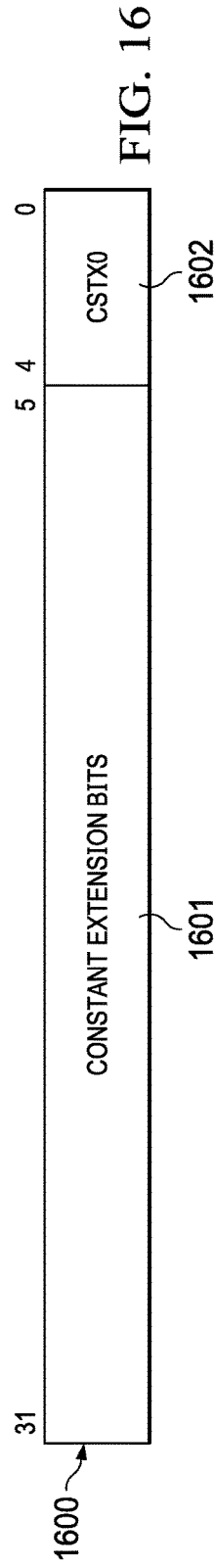

FIG. 21

2100: bits 511–448 LANE 7 | 447–384 LANE 6 | 383–320 LANE 5 | 319–256 LANE 4 | 255–192 LANE 3 | 191–128 LANE 2 | 127–64 LANE 1 | 63–0 LANE 0

FIG. 22

2200: bits 511–480 LANE 15 | 479–448 LANE 14 | 447–416 LANE 13 | 415–384 LANE 12 | 383–352 LANE 11 | 351–320 LANE 10 | 319–288 LANE 9 | 287–256 LANE 8 | 255–224 LANE 7 | 223–192 LANE 6 | 191–160 LANE 5 | 159–128 LANE 4 | 127–96 LANE 3 | 95–64 LANE 2 | 63–32 LANE 1 | 31–0 LANE 0

BUTTERFLY NETWORK ON LOAD DATA RETURN

TECHNICAL FIELD OF THE INVENTION

The technical field of this invention is digital data processing and more specifically input to output data transformation.

BACKGROUND OF THE INVENTION

Modern digital signal processors (DSP) faces multiple challenges. Workloads continue to increase, requiring increasing bandwidth. Systems on a chip (SOC) continue to grow in size and complexity. Memory system latency severely impacts certain classes of algorithms. As transistors get smaller, memories and registers become less reliable. As software stacks get larger, the number of potential interactions and errors becomes larger.

Memory bandwidth and scheduling are a problem for digital signal processors operating on real-time data. Digital signal processors operating on real-time data typically receive an input data stream, perform a filter function on the data stream (such as encoding or decoding) and output a transformed data stream. The system is called real-time because the application fails if the transformed data stream is not available for output when scheduled. Typical video encoding requires a predictable but non-sequential input data pattern. Often the corresponding memory accesses are difficult to achieve within available address generation and memory access resources. A typical application requires memory access to load data registers in a data register file and then supply to functional units which preform the data processing.

SUMMARY OF THE INVENTION

This invention is a digital data processor having a streaming engine which recalls from memory a stream of an instruction specified sequence of a predetermined number of data elements for use in order by data processing functional units. Each data element has a predetermined size and data type. Date elements are packed in lanes of the defined data width in a vector stream head register.

A multilayer butterfly network is operable to transform and align a plurality of fields from an input to an output data stream. Many transformations are possible with such a network which may include separate control of each multiplexer. This invention supports a limited set of multiplexer control signals, which enables a similarly limited set of data transformations. This limited capability is offset by the reduced complexity of the multiplexor control circuits. This invention used precalculated inputs and simple combinatorial logic to generate control signals for the butterfly network. Controls are independent for each layer and therefore are dependent only on the input and output patterns. Controls for the layers can be calculated in parallel.

BRIEF DESCRIPTION OF THE DRAWINGS

These and other aspects of this invention are illustrated in the drawings, in which:

FIG. 13 illustrates an example of the instruction coding of instructions used by this invention;

FIG. 14 illustrates the bit coding of a condition code extension slot 0;

FIG. 15 illustrates the bit coding of a condition code extension slot 1;

FIG. 16 illustrates the bit coding of a constant extension slot 0;

FIG. 21 illustrates a first example of lane allocation in a vector;

FIG. 22 illustrates a second example of lane allocation in a vector;

FIG. 30 illustrates sub-field definitions of the flags field of the stream template register of this invention;

DETAILED DESCRIPTION OF PREFERRED EMBODIMENTS

Figure 1:
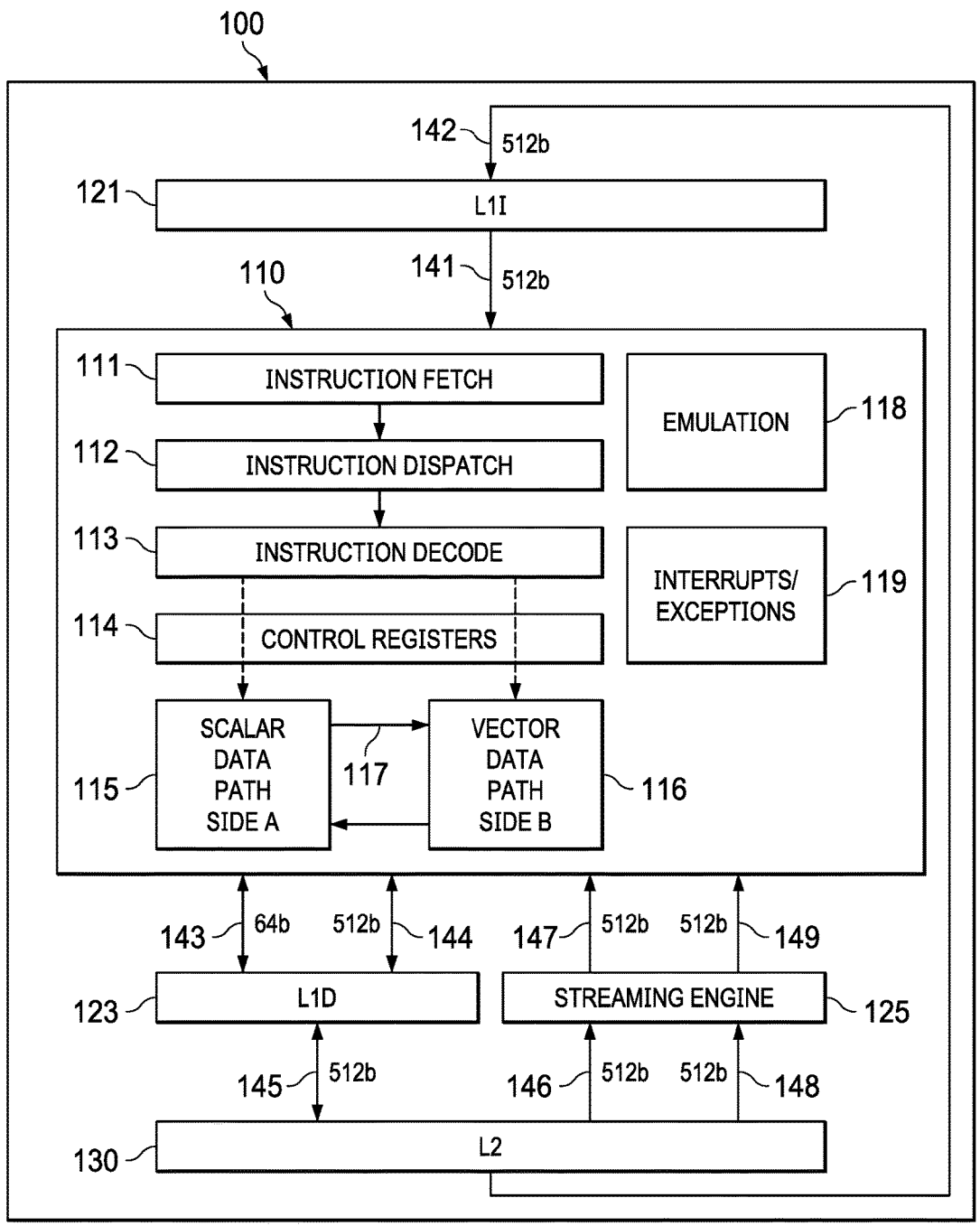
FIG. 1 illustrates a dual scalar/vector datapath processor according to one embodiment of this invention.

FIG. 1 illustrates a dual scalar/vector datapath processor according to a preferred embodiment of this invention.

Processor 100 includes separate level one instruction cache (L1I) 121 and level one data cache (L1D) 123. Processor 100 includes a level two combined instruction/data cache (L2) 130 that holds both instructions and data. FIG. 1 illustrates connection between level one instruction cache 121 and level two combined instruction/data cache 130 (bus 142). FIG. 1 illustrates connection between level one data cache 123 and level two combined instruction/data cache 130 (bus 145). In the preferred embodiment of processor 100 level two combined instruction/data cache 130 stores both instructions to back up level one instruction cache 121 and data to back up level one data cache 123. In the preferred embodiment level two combined instruction/data cache 130 is further connected to higher level cache and/or main memory in a manner known in the art and not illustrated in FIG. 1. In the preferred embodiment, central processing unit core 110, level one instruction cache 121, level one data cache 123 and level two combined instruction/data cache 130 are formed on a single integrated circuit. This signal integrated circuit optionally includes other circuits.

Central processing unit core 110 fetches instructions from level one instruction cache 121 as controlled by instruction fetch unit 111. Instruction fetch unit 111 determines the next instructions to be executed and recalls a fetch packet sized set of such instructions. The nature and size of fetch packets are further detailed below. As known in the art, instructions are directly fetched from level one instruction cache 121 upon a cache hit (if these instructions are stored in level one instruction cache 121). Upon a cache miss (the specified instruction fetch packet is not stored in level one instruction cache 121), these instructions are sought in level two combined cache 130. In the preferred embodiment, the size of a cache line in level one instruction cache 121 equals the size of a fetch packet. The memory locations of these instructions are either a hit in level two combined cache 130 or a miss. A hit is serviced from level two combined cache 130. A miss is serviced from a higher level of cache (not illustrated) or from main memory (not illustrated). As is known in the art, the requested instruction may be simultaneously supplied to both level one instruction cache 121 and central processing unit core 110 to speed use.

In the preferred embodiment of this invention, central processing unit core 110 includes plural functional units to perform instruction specified data processing tasks.

Instruction dispatch unit 112 determines the target functional unit of each fetched instruction. In the preferred embodiment, central processing unit 110 operates as a very long instruction word (VLIW) processor capable of operating on plural instructions in corresponding functional units simultaneously. Preferably a complier organizes instructions in execute packets that are executed together. Instruction dispatch unit 112 directs each instruction to its target functional unit. The functional unit assigned to an instruction is completely specified by the instruction produced by a compiler. The hardware of central processing unit core 110 has no part in this functional unit assignment. In the preferred embodiment instruction dispatch unit 112 may operate on plural instructions in parallel. The number of such parallel instructions is set by the size of the execute packet. This will be further detailed below.

One part of the dispatch task of instruction dispatch unit 112 is determining whether the instruction is to execute on a functional unit in scalar datapath side A 115 or vector datapath side B 116. An instruction bit within each instruction called the s bit determines which datapath the instruction controls. This will be further detailed below.

Instruction decode unit 113 decodes each instruction in a current execute packet. Decoding includes identification of the functional unit performing the instruction, identification of registers used to supply data for the corresponding data processing operation from among possible register files and identification of the register destination of the results of the corresponding data processing operation. As further explained below, instructions may include a constant field in place of one register number operand field. The result of this decoding is signals for control of the target functional unit to perform the data processing operation specified by the corresponding instruction on the specified data.

Central processing unit core 110 includes control registers 114. Control registers 114 store information for control of the functional units in scalar datapath side A 115 and vector datapath side B 116 in a manner not relevant to this invention. This information could be mode information or the like.

The decoded instructions from instruction decode 113 and information stored in control registers 114 are supplied to scalar datapath side A 115 and vector datapath side B 116. As a result, functional units within scalar datapath side A 115 and vector datapath side B 116 perform instruction specified data processing operations upon instruction specified data and store the results in an instruction specified data register or registers. Each of scalar datapath side A 115 and vector datapath side B 116 include plural functional units that preferably operate in parallel. These will be further detailed below in conjunction with FIG. 2. There is a datapath 117 between scalar datapath side A 115 and vector datapath side B 116 permitting data exchange.

Central processing unit core 110 includes further non-instruction based modules. Emulation unit 118 permits determination of the machine state of central processing unit core 110 in response to instructions. This capability will typically be employed for algorithmic development. Interrupts/exceptions unit 119 enable central processing unit core 110 to be responsive to external, asynchronous events (interrupts) and to respond to attempts to perform improper operations (exceptions).

Central processing unit core 110 includes streaming engine 125. Streaming engine 125 supplies two data streams from predetermined addresses typically cached in level two combined cache 130 to register files of vector datapath side B. This provides controlled data movement from memory (as cached in level two combined cache 130) directly to functional unit operand inputs. This is further detailed below.

FIG. 1 illustrates exemplary data widths of busses between various parts. Level one instruction cache 121 supplies instructions to instruction fetch unit 111 via bus 141. Bus 141 is preferably a 512-bit bus. Bus 141 is unidirectional from level one instruction cache 121 to central processing unit 110. Level two combined cache 130 supplies instructions to level one instruction cache 121 via bus 142. Bus 142 is preferably a 512-bit bus. Bus 142 is unidirectional from level two combined cache 130 to level one instruction cache 121.

Level one data cache 123 exchanges data with register files in scalar datapath side A 115 via bus 143. Bus 143 is preferably a 64-bit bus. Level one data cache 123 exchanges data with register files in vector datapath side B 116 via bus 144. Bus 144 is preferably a 512-bit bus. Busses 143 and 144 are illustrated as bidirectional supporting both central processing unit 110 data reads and data writes. Level one data cache 123 exchanges data with level two combined cache 130 via bus 145. Bus 145 is preferably a 512-bit bus. Bus 145 is illustrated as bidirectional supporting cache service for both central processing unit 110 data reads and data writes.

As known in the art, CPU data requests are directly fetched from level one data cache 123 upon a cache hit (if the requested data is stored in level one data cache 123). Upon a cache miss (the specified data is not stored in level one data cache 123), this data is sought in level two combined cache 130. The memory locations of this requested data is either a hit in level two combined cache 130 or a miss. A hit is serviced from level two combined cache 130. A miss is serviced from another level of cache (not illustrated) or from main memory (not illustrated). As is known in the art, the requested instruction may be simultaneously supplied to both level one data cache 123 and central processing unit core 110 to speed use.

Level two combined cache 130 supplies data of a first data stream to streaming engine 125 via bus 146. Bus 146 is preferably a 512-bit bus. Streaming engine 125 supplies data of this first data stream to functional units of vector datapath side B 116 via bus 147. Bus 147 is preferably a 512-bit bus. Level two combined cache 130 supplies data of a second data stream to streaming engine 125 via bus 148. Bus 148 is preferably a 512-bit bus. Streaming engine 125 supplies data of this second data stream to functional units of vector datapath side B 116 via bus 149. Bus 149 is preferably a 512-bit bus. Busses 146, 147, 148 and 149 are illustrated as unidirectional from level two combined cache 130 to streaming engine 125 and to vector datapath side B 116 in accordance with the preferred embodiment of this invention.

Steaming engine data requests are directly fetched from level two combined cache 130 upon a cache hit (if the requested data is stored in level two combined cache 130). Upon a cache miss (the specified data is not stored in level two combined cache 130), this data is sought from another level of cache (not illustrated) or from main memory (not illustrated). It is technically feasible in some embodiments for level one data cache 123 to cache data not stored in level two combined cache 130. If such operation is supported, then upon a streaming engine data request that is a miss in level two combined cache 130, level two combined cache 130 should snoop level one data cache 1233 for the stream engine requested data. If level one data cache 123 stores this data its snoop response would include the data, which is then supplied to service the streaming engine request. If level one data cache 123 does not store this data its snoop response would indicate this and level two combined cache 130 must service this streaming engine request from another level of cache (not illustrated) or from main memory (not illustrated).

In the preferred embodiment of this invention, both level one data cache 123 and level two combined cache 130 may be configured as selected amounts of cache or directly addressable memory in accordance with U.S. Pat. No. 6,606,686 entitled UNIFIED MEMORY SYSTEM ARCHITECTURE INCLUDING CACHE AND DIRECTLY ADDRESSABLE STATIC RANDOM ACCESS MEMORY.

Figure 2:
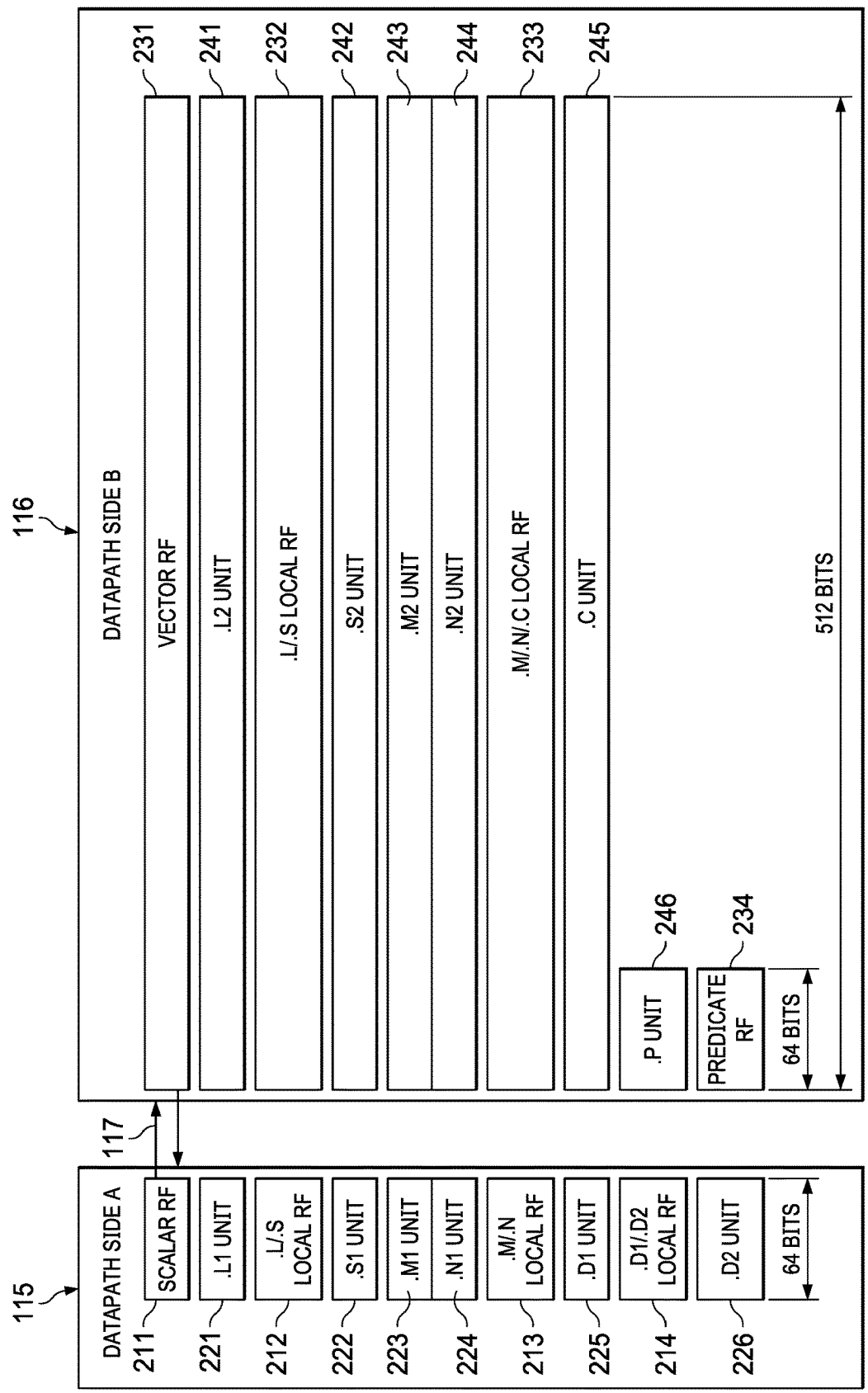
FIG. 2 illustrates the registers and functional units in the dual scalar/vector datapath processor illustrated in FIG. 1.

FIG. 2 illustrates further details of functional units and register files within scalar datapath side A 115 and vector datapath side B 116. Scalar datapath side A 115 includes global scalar register file 211, L1/S1 local register file 212, M1/N1 local register file 213 and D1/D2 local register file 214. Scalar datapath side A 115 includes L1 unit 221, S1 unit 222, M1 unit 223, N1 unit 224, D1 unit 225 and D2 unit 226. Vector datapath side B 116 includes global vector register file 231, L2/S2 local register file 232, M2/N2/C local register file 233 and predicate register file 234. Vector datapath side B 116 includes L2 unit 241, S2 unit 242, M2 unit 243, N2 unit 244, C unit 245 and P unit 246. There are limitations upon which functional units may read from or write to which register files. These will be detailed below.

Scalar datapath side A 115 includes L1 unit 221. L1 unit 221 generally accepts two 64-bit operands and produces one 64-bit result. The two operands are each recalled from an instruction specified register in either global scalar register file 211 or L1/S1 local register file 212. L1 unit 221 preferably performs the following instruction selected operations: 64-bit add/subtract operations; 32-bit min/max operations; 8-bit Single Instruction Multiple Data (SIMD) instructions such as sum of absolute value, minimum and maximum determinations; circular min/max operations; and various move operations between register files. The result may be written into an instruction specified register of global scalar register file 211, L1/S1 local register file 212, M1/N1 local register file 213 or D1/D2 local register file 214.

Scalar datapath side A 115 includes S1 unit 222. S1 unit 222 generally accepts two 64-bit operands and produces one 64-bit result. The two operands are each recalled from an instruction specified register in either global scalar register file 211 or L1/S1 local register file 212. S1 unit 222 preferably performs the same type operations as L1 unit 221. There optionally may be slight variations between the data processing operations supported by L1 unit 221 and S1 unit 222. The result may be written into an instruction specified register of global scalar register file 211, L1/S1 local register file 212, M1/N1 local register file 213 or D1/D2 local register file 214.

Scalar datapath side A 115 includes M1 unit 223. M1 unit 223 generally accepts two 64-bit operands and produces one 64-bit result. The two operands are each recalled from an instruction specified register in either global scalar register file 211 or M1/N1 local register file 213. M1 unit 223 preferably performs the following instruction selected operations: 8-bit multiply operations; complex dot product operations; 32-bit bit count operations; complex conjugate multiply operations; and bit-wise Logical Operations, moves, adds and subtracts. The result may be written into an instruction specified register of global scalar register file 211, L1/S1 local register file 212, M1/N1 local register file 213 or D1/D2 local register file 214.

Scalar datapath side A 115 includes N1 unit 224. N1 unit 224 generally accepts two 64-bit operands and produces one 64-bit result. The two operands are each recalled from an instruction specified register in either global scalar register file 211 or M1/N1 local register file 213. N1 unit 224 preferably performs the same type operations as M1 unit 223. There may be certain double operations (called dual issued instructions) that employ both the M1 unit 223 and the N1 unit 224 together. The result may be written into an instruction specified register of global scalar register file 211, L1/S1 local register file 212, M1/N1 local register file 213 or D1/D2 local register file 214.

Scalar datapath side A 115 includes D1 unit 225 and D2 unit 226. D1 unit 225 and D2 unit 226 generally each accept two 64-bit operands and each produce one 64-bit result. D1 unit 225 and D2 unit 226 generally perform address calculations and corresponding load and store operations. D1 unit 225 is used for scalar loads and stores of 64 bits. D2 unit 226 is used for vector loads and stores of 512 bits. D1 unit 225 and D2 unit 226 preferably also perform: swapping, pack and unpack on the load and store data; 64-bit SIMD arithmetic operations; and 64-bit bit-wise logical operations. D1/D2 local register file 214 will generally store base and offset addresses used in address calculations for the corresponding loads and stores. The two operands are each recalled from an instruction specified register in either global scalar register file 211 or D1/D2 local register file 214. The calculated result may be written into an instruction specified register of global scalar register file 211, L1/S1 local register file 212, M1/N1 local register file 213 or D1/D2 local register file 214.

Vector datapath side B 116 includes L2 unit 241. L2 unit 221 generally accepts two 512-bit operands and produces one 512-bit result. The two operands are each recalled from an instruction specified register in either global vector register file 231, L2/S2 local register file 232 or predicate register file 234. L2 unit 241 preferably performs instruction similar to L1 unit 221 except on wider 512-bit data. The result may be written into an instruction specified register of global vector register file 231, L2/S2 local register file 222, M2/N2/C local register file 233 or predicate register file 234.

Vector datapath side B 116 includes S2 unit 242. S2 unit 242 generally accepts two 512-bit operands and produces one 512-bit result. The two operands are each recalled from an instruction specified register in either global vector register file 231, L2/S2 local register file 232 or predicate register file 234. S2 unit 242 preferably performs instructions similar to S1 unit 222. The result may be written into an instruction specified register of global vector register file 231, L2/S2 local register file 222, M2/N2/C local register file 233 or predicate register file 234.

Vector datapath side B 116 includes M2 unit 243. M2 unit 243 generally accepts two 512-bit operands and produces one 512-bit result. The two operands are each recalled from an instruction specified register in either global vector register file 231 or M2/N2/C local register file 233. M2 unit 243 preferably performs instructions similar to M1 unit 222 except on wider 512-bit data. The result may be written into an instruction specified register of global vector register file 231, L2/S2 local register file 232 or M2/N2/C local register file 233.

Vector datapath side B 116 includes N2 unit 244. N2 unit 244 generally accepts two 512-bit operands and produces one 512-bit result. The two operands are each recalled from an instruction specified register in either global vector register file 231 or M2/N2/C local register file 233. N2 unit 244 preferably performs the same type operations as M2 unit 243. There may be certain double operations (called dual issued instructions) that employ both M2 unit 243 and the N2 unit 244 together. The result may be written into an instruction specified register of global vector register file 231, L2/S2 local register file 232 or M2/N2/C local register file 233.

Vector datapath side B 116 includes C unit 245. C unit 245 generally accepts two 512-bit operands and produces one 512-bit result. The two operands are each recalled from an instruction specified register in either global vector register file 231 or M2/N2/C local register file 233. C unit 245 preferably performs: "Rake" and "Search" instructions; up to 512 2-bit PN*8-bit multiplies I/Q complex multiplies per clock cycle; 8-bit and 16-bit Sum-of-Absolute-Difference (SAD) calculations, up to 512 SADs per clock cycle; horizontal add and horizontal min/max instructions; and vector permutes instructions. C unit 245 also contains 4 vector control registers (CUCR0 to CUCR3) used to control certain operations of C unit 245 instructions. Control registers CUCR0 to CUCR3 are used as operands in certain C unit 245 operations. Control registers CUCR0 to CUCR3 are preferably used: in control of a general permutation instruction (VPERM); and as masks for SIMD multiple DOT product operations (DOTPM) and SIMD multiple Sum-of-Absolute-Difference (SAD) operations. Control register CUCR0 is preferably used to store the polynomials for Galois Field Multiply operations (GFMPY). Control register CUCR1 is preferably used to store the Galois field polynomial generator function.

Vector datapath side B 116 includes P unit 246. P unit 246 performs basic logic operations on registers of local predicate register file 234. P unit 246 has direct access to read from and write to predication register file 234. These operations include single register unary operations such as: NEG (negate) which inverts each bit of the single register; BITCNT (bit count) which returns a count of the number of bits in the single register having a predetermined digital state (1 or 0); RMBD (right most bit detect) which returns a number of bit positions from the least significant bit position (right most) to a first bit position having a predetermined digital state (1 or 0); DECIMATE which selects every instruction specified Nth (1, 2, 4, etc.) bit to output; and EXPAND which replicates each bit an instruction specified N times (2, 4, etc.). These operations include two register binary operations such as: AND a bitwise AND of data of the two registers; NAND a bitwise AND and negate of data of the two registers; OR a bitwise OR of data of the two registers; NOR a bitwise OR and negate of data of the two registers; and XOR exclusive OR of data of the two registers. These operations include transfer of data from a predicate register of predicate register file 234 to another specified predicate register or to a specified data register in global vector register file 231. A commonly expected use of P unit 246 includes manipulation of the SIMD vector comparison results for use in control of a further SIMD vector operation. The BITCNT instruction may be used to count the number of 1's in a predicate register to determine the number of valid data elements from a predicate register.

Figure 3:
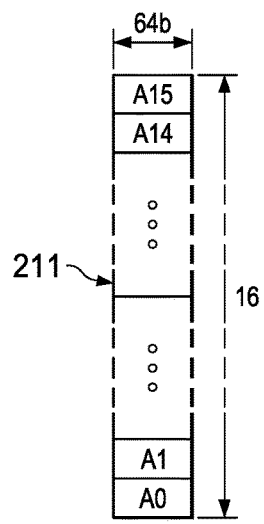
FIG. 3 illustrates the global scalar register file.

FIG. 3 illustrates global scalar register file 211. There are 16 independent 64-bit wide scalar registers designated A0 to A15. Each register of global scalar register file 211 can be read from or written to as 64-bits of scalar data. All scalar datapath side A 115 functional units (L1 unit 221, S1 unit 222, M1 unit 223, N1 unit 224, D1 unit 225 and D2 unit 226) can read or write to global scalar register file 211. Global scalar register file 211 may be read as 32-bits or as 64-bits and may only be written to as 64-bits. The instruction executing determines the read data size. Vector datapath side B 116 functional units (L2 unit 241, S2 unit 242, M2 unit 243, N2 unit 244, C unit 245 and P unit 246) can read from global scalar register file 211 via crosspath 117 under restrictions that will be detailed below.

Figure 4:
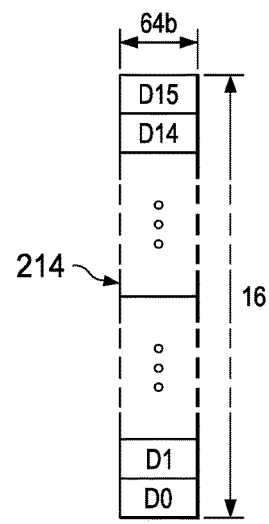
FIG. 4 illustrates the local scalar register file shared by arithmetic functional units.

FIG. 4 illustrates D1/D2 local register file 214. There are 16 independent 64-bit wide scalar registers designated D0 to D16. Each register of D1/D2 local register file 214 can be read from or written to as 64-bits of scalar data. All scalar datapath side A 115 functional units (L1 unit 221, S1 unit 222, M1 unit 223, N1 unit 224, D1 unit 225 and D2 unit 226) can write to global scalar register file 211. Only D1 unit 225 and D2 unit 226 can read from D1/D1 local scalar register file 214. It is expected that data stored in D1/D2 local scalar register file 214 will include base addresses and offset addresses used in address calculation.

Figure 5:
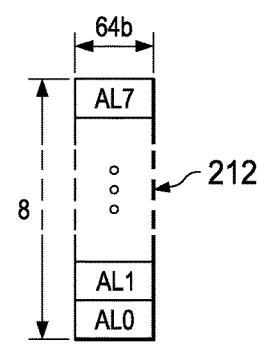
FIG. 5 illustrates the local scalar register file shared by the multiply functional units.

FIG. 5 illustrates L1/S1 local register file 212. The embodiment illustrated in FIG. 5 has 8 independent 64-bit wide scalar registers designated AL0 to AL7. The preferred instruction coding (see FIG. 13) permits L1/S1 local register file 212 to include up to 16 registers. The embodiment of FIG. 5 implements only 8 registers to reduce circuit size and complexity. Each register of L1/S1 local register file 212 can be read from or written to as 64-bits of scalar data. All scalar datapath side A 115 functional units (L1 unit 221, S1 unit 222, M1 unit 223, N1 unit 224, D1 unit 225 and D2 unit 226) can write to L1/S1 local scalar register file 212. Only L1 unit 221 and S1 unit 222 can read from L1/S1 local scalar register file 212.

Figure 6:
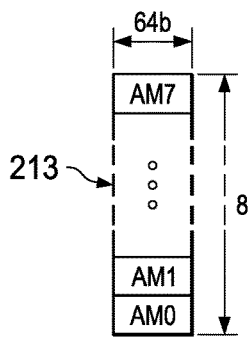
FIG. 6 illustrates local scalar register file of shared by the load/store units.

FIG. 6 illustrates M1/N1 local register file 213. The embodiment illustrated in FIG. 6 has 8 independent 64-bit wide scalar registers designated AM0 to AM7. The preferred instruction coding (see FIG. 13) permits M1/N1 local register file 213 to include up to 16 registers. The embodiment of FIG. 6 implements only 8 registers to reduce circuit size and complexity. Each register of M1/N1 local register file 213 can be read from or written to as 64-bits of scalar data. All scalar datapath side A 115 functional units (L1 unit 221, S1 unit 222, M1 unit 223, N1 unit 224, D1 unit 225 and D2 unit 226) can write to M1/N1 local scalar register file 213. Only M1 unit 223 and N1 unit 224 can read from M1/N1 local scalar register file 213.

Figure 7:
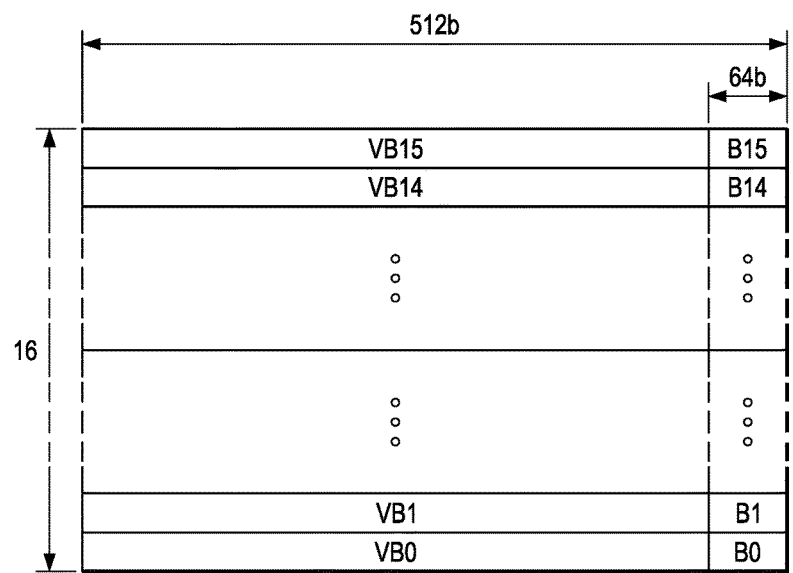
FIG. 7 illustrates global vector register file.

FIG. 7 illustrates global vector register file 231. There are 16 independent 512-bit wide vector registers. Each register of global vector register file 231 can be read from or written to as 64-bits of scalar data designated B0 to B15. Each register of global vector register file 231 can be read from or written to as 512-bits of vector data designated VB0 to VB15. The instruction type determines the data size. All vector datapath side B 116 functional units (L2 unit 241, S2 unit 242, M3 unit 243, N2 unit 244, C unit 245 and P unit 246) can read or write to global scalar register file 231. Scalar datapath side A 115 functional units (L1 unit 221, S1 unit 222, M1 unit 223, N1 unit 224, D1 unit 225 and D2 unit 226) can read from global vector register file 231 via crosspath 117 under restrictions that will be detailed below.

Figure 8:
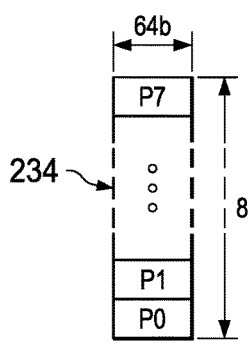
FIG. 8 illustrates the predicate register file.

FIG. 8 illustrates P local register file 234. There are 8 independent 64-bit wide registers designated P0 to P15. Each register of P local register file 234 can be read from or written to as 64-bits of scalar data. Vector datapath side B 116 functional units L2 unit 241, S2 unit 242, C unit 244 and P unit 246 can write to P local register file 234. Only L2 unit 241, S2 unit 242 and P unit 246 can read from P local scalar register file 234. A commonly expected use of P local register file 234 includes: writing one bit SIMD vector comparison results from L2 unit 241, S2 unit 242 or C unit 244; manipulation of the SIMD vector comparison results by P unit 246; and use of the manipulated results in control of a further SIMD vector operation.

Figure 9:
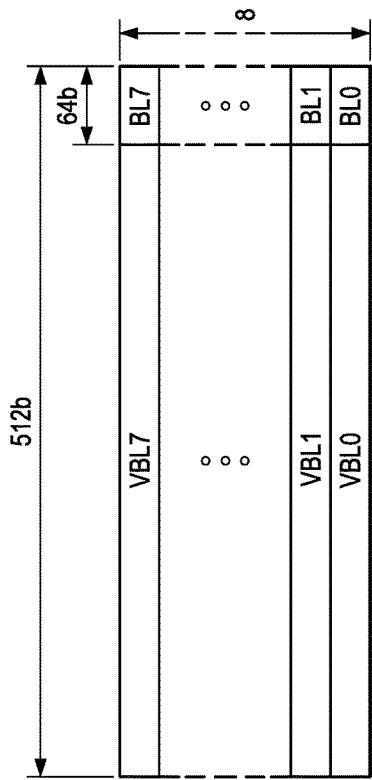
FIG. 9 illustrates the local vector register file shared by arithmetic functional units.

FIG. 9 illustrates L2/S2 local register file 232. The embodiment illustrated in FIG. 9 has 8 independent 512-bit wide vector registers. The preferred instruction coding (see FIG. 13) permits L2/S2 local register file 232 to include up to 16 registers. The embodiment of FIG. 9 implements only 8 registers to reduce circuit size and complexity. Each register of L2/S2 local vector register file 232 can be read from or written to as 64-bits of scalar data designated BL0 to BL7. Each register of L2/S2 local vector register file 232 can be read from or written to as 512-bits of vector data designated VBL0 to VBL7. The instruction type determines the data size. All vector datapath side B 116 functional units (L2 unit 241, S2 unit 242, M2 unit 233, N2 unit 24, C unit 245 and P unit 246) can write to L2/S2 local vector register file 232. Only L2 unit 241 and S2 unit 242 can read from L2/S2 local vector register file 232.

Figure 10:
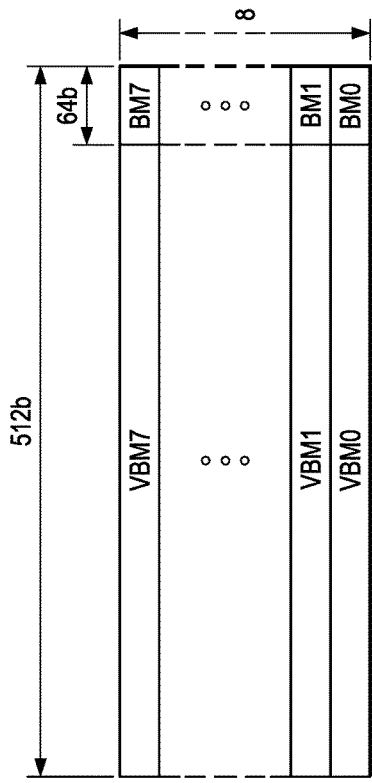
FIG. 10 illustrates the local vector register file shared by the multiply and correlation functional units.

FIG. 10 illustrates M2/N2/C local register file 233. The embodiment illustrated in FIG. 10 has 8 independent 512-bit wide vector registers. The preferred instruction coding (see FIG. 13) permits L1/S1 local register file 212 to include up to 16 registers. The embodiment of FIG. 10 implements only 8 registers to reduce circuit size and complexity. Each register of M2/N2/C local vector register file 233 can be read from or written to as 64-bits of scalar data designated BM0 to BM7. Each register of M2/N2/C local vector register file 233 can be read from or written to as 512-bits of vector data designated VBM0 to VBM7. All vector datapath side B 116 functional units (L2 unit 241, S2 unit 242, M2 unit 243, N2 unit 244, C unit 245 and P unit 246) can write to M2/N2/C local vector register file 233. Only M2 unit 233, N2 unit 244 and C unit 245 can read from M2/N2/C local vector register file 233.

The provision of global register files accessible by all functional units of a side and local register files accessible by only some of the functional units of a side is a design choice. This invention could be practiced employing only one type of register file corresponding to the disclosed global register files.

Crosspath 117 permits limited exchange of data between scalar datapath side A 115 and vector datapath side B 116. During each operational cycle one 64-bit data word can be recalled from global scalar register file A 211 for use as an operand by one or more functional units of vector datapath side B 116 and one 64-bit data word can be recalled from global vector register file 231 for use as an operand by one or more functional units of scalar datapath side A 115. Any scalar datapath side A 115 functional unit (L1 unit 221, S1 unit 222, M1 unit 223, N1 unit 224, D1 unit 225 and D2 unit 226) may read a 64-bit operand from global vector register file 231. This 64-bit operand is the least significant bits of the 512-bit data in the accessed register of global vector register file 232. Plural scalar datapath side A 115 functional units may employ the same 64-bit crosspath data as an operand during the same operational cycle. However, only one 64-bit operand is transferred from vector datapath side B 116 to scalar datapath side A 115 in any single operational cycle. Any vector datapath side B 116 functional unit (L2 unit 241, S2 unit 242, M2 unit 243, N2 unit 244, C unit 245 and P unit 246) may read a 64-bit operand from global scalar register file 211. If the corresponding instruction is a scalar instruction, the crosspath operand data is treated as any other 64-bit operand. If the corresponding instruction is a vector instruction, the upper 448 bits of the operand are zero filled. Plural vector datapath side B 116 functional units may employ the same 64-bit crosspath data as an operand during the same operational cycle. Only one 64-bit operand is transferred from scalar datapath side A 115 to vector datapath side B 116 in any single operational cycle.

Streaming engine 125 transfers data in certain restricted circumstances. Streaming engine 125 controls two data streams. A stream consists of a sequence of elements of a particular type. Programs that operate on streams read the data sequentially, operating on each element in turn. Every stream has the following basic properties. The stream data have a well-defined beginning and ending in time. The stream data have fixed element size and type throughout the stream. The stream data have fixed sequence of elements. Thus, programs cannot seek randomly within the stream. The stream data is read-only while active. Programs cannot write to a stream while simultaneously reading from it. Once a stream is opened streaming engine 125: calculates the address; fetches the defined data type from level two unified cache (which may require cache service from a higher level memory); performs data type manipulation such as zero extension, sign extension, data element sorting/swapping such as matrix transposition; and delivers the data directly to the programmed data register file within CPU 110. Streaming engine 125 is thus useful for real-time digital filtering operations on well-behaved data. Streaming engine 125 frees these memory fetch tasks from the corresponding CPU enabling other processing functions.

Streaming engine 125 provides the following benefits. Streaming engine 125 permits multi-dimensional memory accesses. Streaming engine 125 increases the available bandwidth to the functional units. Streaming engine 125 minimizes the number of cache miss stalls since the stream buffer bypasses level one data cache 123 Streaming engine 125 reduces the number of scalar operations required to maintain a loop. Streaming engine 125 manages address pointers. Streaming engine 125 handles address generation automatically freeing up the address generation instruction slots and D1 unit 224 and D2 unit 226 for other computations.

CPU 110 operates on an instruction pipeline. Instructions are fetched in instruction packets of fixed length further described below. All instructions require the same number of pipeline phases for fetch and decode, but require a varying number of execute phases.

Figure 11:
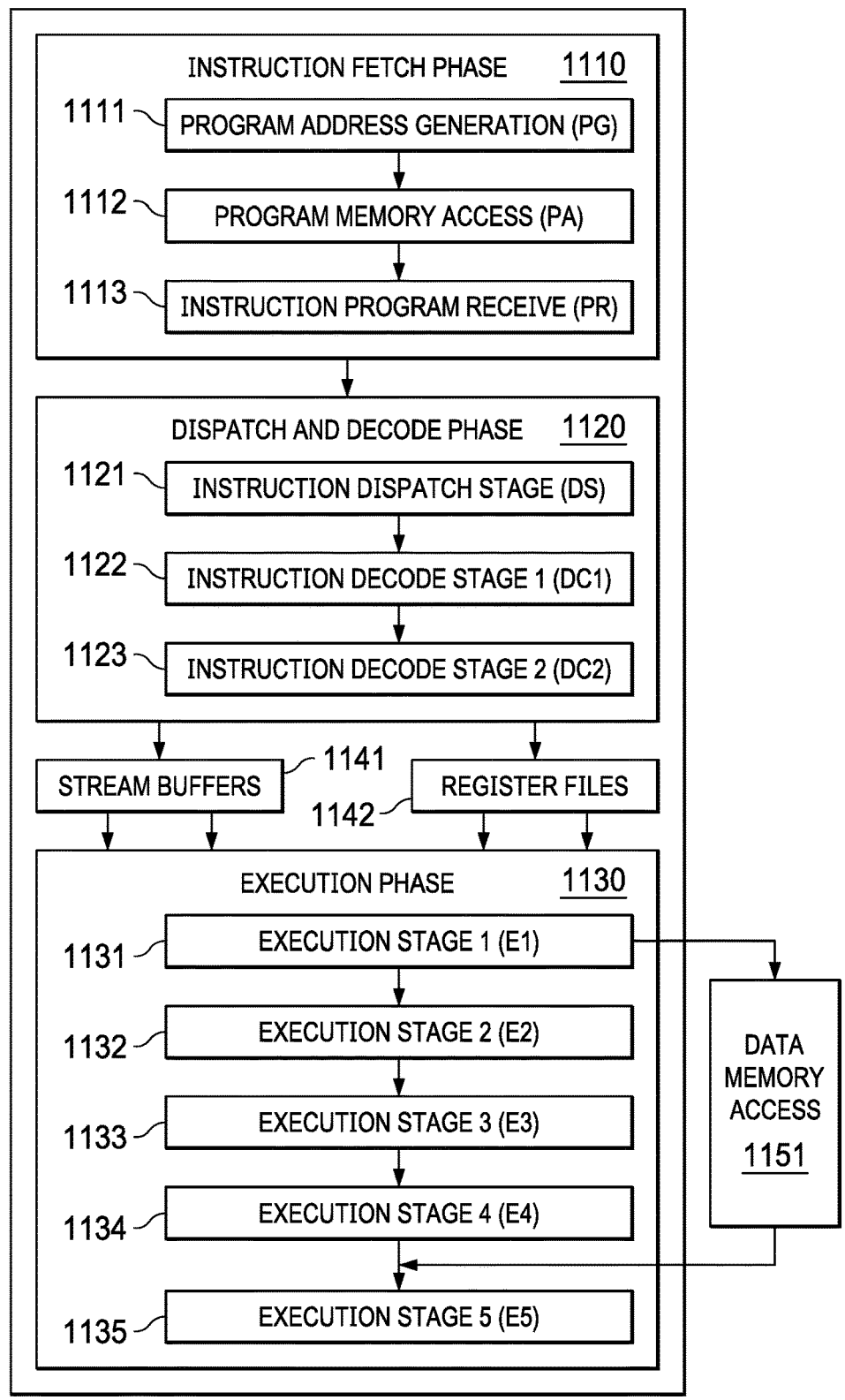
FIG. 11 illustrates the pipeline phases of the central processing unit according to a preferred embodiment of this invention.

FIG. 11 illustrates the following pipeline phases: program fetch phase 1110, dispatch and decode phases 1120 and execution phases 1130. Program fetch phase 1110 includes three stages for all instructions. Dispatch and decode phases include three stages for all instructions. Execution phase 1130 includes one to four stages dependent on the instruction.

Fetch phase 1110 includes program address generation stage 1111 (PG), program access stage 1112 (PA) and program receive stage 1113 (PR). During program address generation stage 1111 (PG), the program address is generated in the CPU and the read request is sent to the memory controller for the level one instruction cache L1I. During the program access stage 1112 (PA) the level one instruction cache L1I processes the request, accesses the data in its memory and sends a fetch packet to the CPU boundary. During the program receive stage 1113 (PR) the CPU registers the fetch packet.

Figure 12:
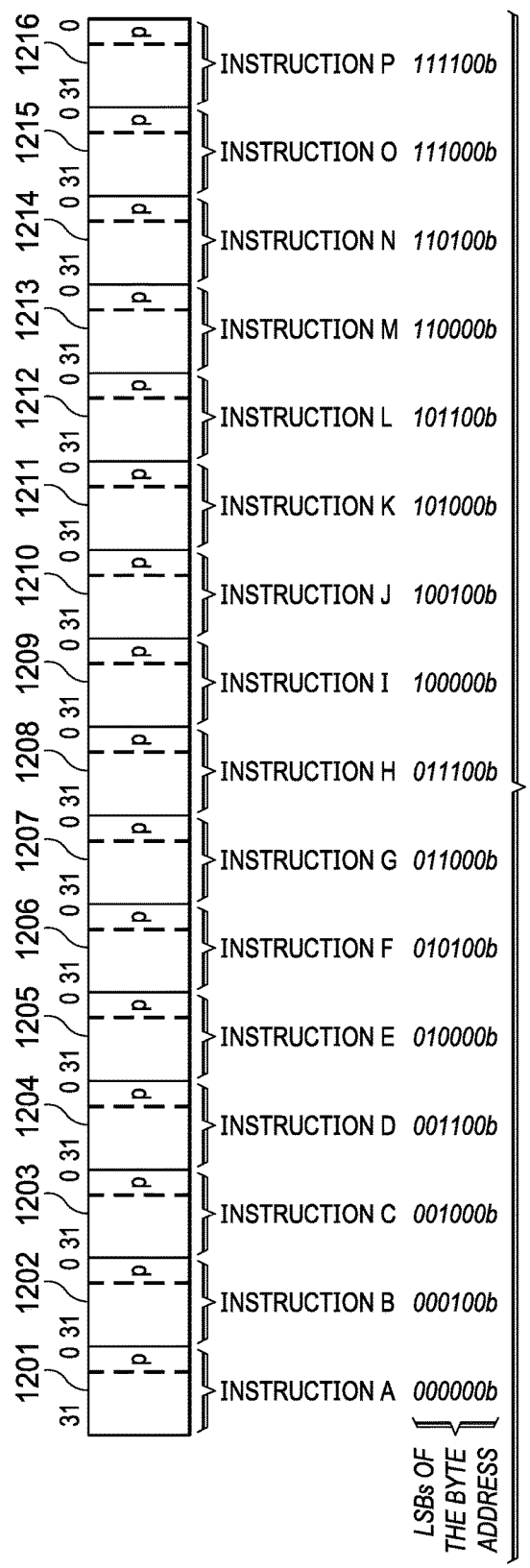
FIG. 12 illustrates sixteen instructions of a single fetch packet.

Instructions are always fetched sixteen 32-bit wide slots, constituting a fetch packet, at a time. FIG. 12 illustrates 16 instructions 1201 to 1216 of a single fetch packet. Fetch packets are aligned on 512-bit (16-word) boundaries. The preferred embodiment employs a fixed 32-bit instruction length. Fixed length instructions are advantageous for several reasons. Fixed length instructions enable easy decoder alignment. A properly aligned instruction fetch can load plural instructions into parallel instruction decoders. Such a properly aligned instruction fetch can be achieved by pre-determined instruction alignment when stored in memory (fetch packets aligned on 512-bit boundaries) coupled with a fixed instruction packet fetch. An aligned instruction fetch permits operation of parallel decoders on instruction-sized fetched bits. Variable length instructions require an initial step of locating each instruction boundary before they can be decoded. A fixed length instruction set generally permits more regular layout of instruction fields. This simplifies the construction of each decoder which is an advantage for a wide issue VLIW central processor.

The execution of the individual instructions is partially controlled by a p bit in each instruction. This p bit is preferably bit 0 of the 32-bit wide slot. The p bit determines whether an instruction executes in parallel with a next instruction. Instructions are scanned from lower to higher address. If the p bit of an instruction is 1, then the next following instruction (higher memory address) is executed in parallel with (in the same cycle as) that instruction. If the p bit of an instruction is 0, then the next following instruction is executed in the cycle after the instruction.

CPU 110 and level one instruction cache L1I 121 pipelines are de-coupled from each other. Fetch packet returns from level one instruction cache L1I can take different number of clock cycles, depending on external circumstances such as whether there is a hit in level one instruction cache 121 or a hit in level two combined cache 130. Therefore, program access stage 1112 (PA) can take several clock cycles instead of 1 clock cycle as in the other stages.

The instructions executing in parallel constitute an execute packet. In the preferred embodiment, an execute packet can contain up to sixteen instructions. No two instructions in an execute packet may use the same functional unit. A slot is one of five types: 1) a self-contained instruction executed on one of the functional units of CPU 110 (L1 unit 221, S1 unit 222, M1 unit 223, N1 unit 224, D1 unit 225, D2 unit 226, L2 unit 241, S2 unit 242, M2 unit 243, N2 unit 244, C unit 245 and P unit 246); 2) a unitless instruction such as a NOP (no operation) instruction or multiple NOP instruction; 3) a branch instruction; 4) a constant field extension; and 5) a conditional code extension. Some of these slot types will be further explained below.

Dispatch and decode phases 1110 include instruction dispatch to appropriate execution unit stage 1121 (DS), instruction pre-decode stage 1122 (D1); and instruction decode, operand reads stage 1222 (D2). During instruction dispatch to appropriate execution unit stage 1121 (DS) the fetch packets are split into execute packets and assigned to the appropriate functional units. During the instruction pre-decode stage 1122 (D1) the source registers, destination registers and associated paths are decoded for the execution of the instructions in the functional units. During the instruction decode, operand reads stage 1222 (D2) more detail unit decodes are done, as well as reading operands from the register files.

Execution phases 1130 includes execution stages 1131 to 1135 (E1 to E5). Different types of instructions require different numbers of these stages to complete their execution. These stages of the pipeline play an important role in understanding the device state at CPU cycle boundaries.

During execute 1 stage 1131 (E1) the conditions for the instructions are evaluated and operands are operated on. As illustrated in FIG. 11, execute 1 stage 1131 may receive operands from a stream buffer 1141 and one of the register files shown schematically as 1142. For load and store instructions, address generation is performed and address modifications are written to a register file. For branch instructions, branch fetch packet in PG phase is affected. As illustrated in FIG. 11, load and store instructions access memory here shown schematically as memory 1151. For single-cycle instructions, results are written to a destination register file. This assumes that any conditions for the instructions are evaluated as true. If a condition is evaluated as false, the instruction does not write any results or have any pipeline operation after execute 1 stage 1131. During execute 2 stage 1132 (E2) load instructions send the address to memory. Store instructions send the address and data to memory. Single-cycle instructions that saturate results set the SAT bit in the control status register (CSR) if saturation occurs. For 2-cycle instructions, results are written to a destination register file.

During execute 3 stage 1133 (E3) data memory accesses are performed. Any multiply instructions that saturate results set the SAT bit in the control status register (CSR) if saturation occurs. For 3-cycle instructions, results are written to a destination register file.

During execute 4 stage 1134 (E4) load instructions bring data to the CPU boundary. For 4-cycle instructions, results are written to a destination register file.

During execute 5 stage 1135 (E5) load instructions write data into a register. This is illustrated schematically in FIG. 11 with input from memory 1151 to execute 5 stage 1135.

FIG. 13 illustrates an example of the instruction coding 1300 of functional unit instructions used by this invention. Those skilled in the art would realize that other instruction codings are feasible and within the scope of this invention. Each instruction consists of 32 bits and controls the operation of one of the individually controllable functional units (L1 unit 221, S1 unit 222, M1 unit 223, N1 unit 224, D1 unit 225, D2 unit 226, L2 unit 241, S2 unit 242, M2 unit 243, N2 unit 244, C unit 245 and P unit 246). The bit fields are defined as follows.

The creg field 1301 (bits 29 to 31) and the z bit 1302 (bit 28) are optional fields used in conditional instructions. These bits are used for conditional instructions to identify the predicate register and the condition. The z bit 1302 (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field 1301 and the z field 1302 are encoded in the instruction as shown in Table 1.

TABLE 1

| Conditional | creg | | | z |
|---|---|---|---|---|
| Register | 31 | 30 | 29 | 28 |
| Unconditional | 0 | 0 | 0 | 0 |
| Reserved | 0 | 0 | 0 | 1 |
| A0 | 0 | 0 | 1 | z |
| A1 | 0 | 1 | 0 | z |
| A2 | 0 | 1 | 1 | z |
| A3 | 1 | 0 | 0 | z |
| A4 | 1 | 0 | 1 | z |
| A5 | 1 | 1 | 0 | z |
| Reserved | 1 | 1 | x | x |

Execution of a conditional instruction is conditional upon the value stored in the specified data register. This data register is in the global scalar register file 211 for all functional units. Note that "z" in the z bit column refers to the zero/not zero comparison selection noted above and "x" is a don't care state. This coding can only specify a subset of the 16 global registers as predicate registers. This selection was made to preserve bits in the instruction coding. Note that unconditional instructions do not have these optional bits. For unconditional instructions, these bits in fields 1301 and 1302 (28 to 31) are preferably used as additional opcode bits.

The dst field 1303 (bits 23 to 27) specifies a register in a corresponding register file as the destination of the instruction results.

The src2/cst field 1304 (bits 18 to 22) has several meanings depending on the instruction opcode field (bits 4 to 12 for all instructions and additionally bits 28 to 31 for unconditional instructions). The first meaning specifies a register of a corresponding register file as the second operand. The second meaning is an immediate constant. Depending on the instruction type, this is treated as an unsigned integer and zero extended to a specified data length or is treated as a signed integer and sign extended to the specified data length.

The src1 field 1305 (bits 13 to 17) specifies a register in a corresponding register file as the first source operand.

The opcode field 1306 (bits 4 to 12) for all instructions (and additionally bits 28 to 31 for unconditional instructions) specifies the type of instruction and designates appropriate instruction options. This includes unambiguous designation of the functional unit used and operation performed. A detailed explanation of the opcode is beyond the scope of this invention except for the instruction options detailed below.

The e bit 1307 (bit 2) is only used for immediate constant instructions where the constant may be extended. If e=1, then the immediate constant is extended in a manner detailed below. If e=0, then the immediate constant is not extended. In that case, the immediate constant is specified by the src2/cst field 1304 (bits 18 to 22). Note that this e bit 1307 is used for only some instructions. Accordingly, with proper coding this e bit 1307 may be omitted from instructions which do not need it and this bit used as an additional opcode bit.

The s bit 1307 (bit 1) designates scalar datapath side A 115 or vector datapath side B 116. If s=0, then scalar datapath side A 115 is selected. This limits the functional unit to L1 unit 221, S1 unit 222, M1 unit 223, N1 unit 224, D1 unit 225 and D2 unit 226 and the corresponding register files illustrated in FIG. 2. Similarly, s=1 selects vector datapath side B 116 limiting the functional unit to L2 unit 241, S2 unit 242, M2 unit 243, N2 unit 244, P unit 246 and the corresponding register file illustrated in FIG. 2.

The p bit 1308 (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to twelve instructions. Each instruction in an execute packet must use a different functional unit.

There are two different condition code extension slots. Each execute packet can contain one each of these unique 32-bit condition code extension slots which contains the 4-bit creg/z fields for the instructions in the same execute packet. FIG. 14 illustrates the coding for condition code extension slot 0 and FIG. 15 illustrates the coding for condition code extension slot 1.

FIG. 14 illustrates the coding for condition code extension slot 0 having 32 bits. Field 1401 (bits 28 to 31) specify 4 creg/z bits assigned to the L1 unit 221 instruction in the same execute packet. Field 1402 (bits 27 to 24) specify 4 creg/z bits assigned to the L2 unit 241 instruction in the same execute packet. Field 1403 (bits 19 to 23) specify 4 creg/z bits assigned to the S1 unit 222 instruction in the same execute packet. Field 1404 (bits 16 to 19) specify 4 creg/z bits assigned to the S2 unit 242 instruction in the same execute packet. Field 1405 (bits 12 to 15) specify 4 creg/z bits assigned to the D1 unit 225 instruction in the same execute packet. Field 1406 (bits 8 to 11) specify 4 creg/z bits assigned to the D2 unit 245 instruction in the same execute packet. Field 1407 (bits 6 and 7) is unused/reserved. Field 1408 (bits 0 to 5) are coded a set of unique bits (CCEX0) to identify the condition code extension slot 0. Once this unique ID of condition code extension slot 0 is detected, the corresponding creg/z bits are employed to control conditional execution of any L1 unit 221, L2 unit 241, S1 unit 222, S2 unit 242, D1 unit 224 and D2 unit 225 instruction in the same execution packet. These creg/z bits are interpreted as shown in Table 1. If the corresponding instruction is conditional (includes creg/z bits) the corresponding bits in the condition code extension slot 0 override the condition code bits in the instruction. Note that no execution packet can have more than one instruction directed to a particular execution unit. No execute packet of instructions can contain more than one condition code extension slot 0. Thus, the mapping of creg/z bits to functional unit instruction is unambiguous. Setting the creg/z bits equal to "0000" makes the instruction unconditional. Thus, a properly coded condition code extension slot 0 can make some corresponding instructions conditional and some unconditional.

FIG. 15 illustrates the coding for condition code extension slot 1 having 32 bits. Field 1501 (bits 28 to 31) specify 4 creg/z bits assigned to the M1 unit 223 instruction in the same execute packet. Field 1502 (bits 27 to 24) specify 4 creg/z bits assigned to the M2 unit 243 instruction in the same execute packet. Field 1503 (bits 19 to 23) specify 4 creg/z bits assigned to the C unit 245 instruction in the same execute packet. Field 1504 (bits 16 to 19) specify 4 creg/z bits assigned to the N1 unit 224 instruction in the same execute packet. Field 1505 (bits 12 to 15) specify 4 creg/z bits assigned to the N2 unit 244 instruction in the same execute packet. Field 1506 (bits 5 to 11) is unused/reserved. Field 1507 (bits 0 to 5) are coded a set of unique bits (CCEX1) to identify the condition code extension slot 1. Once this unique ID of condition code extension slot 1 is detected, the corresponding creg/z bits are employed to control conditional execution of any M1 unit 223, M2 unit 243, C unit 245, N1 unit 224 and N2 unit 244 instruction in the same execution packet. These creg/z bits are interpreted as shown in Table 1. If the corresponding instruction is conditional (includes creg/z bits) the corresponding bits in the condition code extension slot 1 override the condition code bits in the instruction. Note that no execution packet can have more than one instruction directed to a particular execution unit. No execute packet of instructions can contain more than one condition code extension slot 1. Thus, the mapping of creg/z bits to functional unit instruction is unambiguous. Setting the creg/z bits equal to "0000" makes the instruction unconditional. Thus, a properly coded condition code extension slot 1 can make some instructions conditional and some unconditional.

It is feasible for both condition code extension slot 0 and condition code extension slot 1 to include a p bit to define an execute packet as described above in conjunction with FIG. 13. In the preferred embodiment, as illustrated in FIGS. 14 and 15, code extension slot 0 and condition code extension slot 1 preferably have bit 0 (p bit) always encoded as 1. Thus, neither condition code extension slot 0 not condition code extension slot 1 can be in the last instruction slot of an execute packet.

There are two different constant extension slots. Each execute packet can contain one each of these unique 32-bit constant extension slots which contains 27 bits to be concatenated as high order bits with the 5-bit constant field 1305 to form a 32-bit constant. As noted in the instruction coding description above only some instructions define the src2/cst field 1304 as a constant rather than a source register identifier. At least some of those instructions may employ a constant extension slot to extend this constant to 32 bits.

FIG. 16 illustrates the fields of constant extension slot 0. Each execute packet may include one instance of constant extension slot 0 and one instance of constant extension slot 1. FIG. 16 illustrates that constant extension slot 0 1600 includes two fields. Field 1601 (bits 5 to 31) constitute the most significant 27 bits of an extended 32-bit constant including the target instruction scr2/cst field 1304 as the five least significant bits. Field 1602 (bits 0 to 4) are coded a set of unique bits (CSTX0) to identify the constant extension slot 0. In the preferred embodiment, constant extension slot 0 1600 can only be used to extend the constant of one of an L1 unit 221 instruction, data in a D1 unit 225 instruction, an S2 unit 242 instruction, an offset in a D2 unit 226 instruction, an M2 unit 243 instruction, an N2 unit 244 instruction, a branch instruction, or a C unit 245 instruction in the same execute packet.

Constant extension slot 1 is similar to constant extension slot 0 except that bits 0 to 4 are coded a set of unique bits (CSTX1) to identify the constant extension slot 1. In the preferred embodiment, constant extension slot 1 can only be used to extend the constant of one of an L2 unit 241 instruction, data in a D2 unit 226 instruction, an S1 unit 222 instruction, an offset in a D1 unit 225 instruction, an M1 unit 223 instruction or an N1 unit 224 instruction in the same execute packet.

Constant extension slot 0 and constant extension slot 1 are used as follows. The target instruction must be of the type permitting constant specification. As known in the art this is implemented by replacing one input operand register specification field with the least significant bits of the constant as described above with respect to scr2/cst field 1304. Instruction decoder 113 determines this case, known as an immediate field, from the instruction opcode bits. The target instruction also includes one constant extension bit (e bit 1307) dedicated to signaling whether the specified constant is not extended (preferably constant extension bit=0) or the constant is extended (preferably constant extension bit=1). If instruction decoder 113 detects a constant extension slot 0 or a constant extension slot 1, it further checks the other instructions within that execute packet for an instruction corresponding to the detected constant extension slot. A constant extension is made only if one corresponding instruction has a constant extension bit (e bit 1307) equal to 1.

Figure 17:
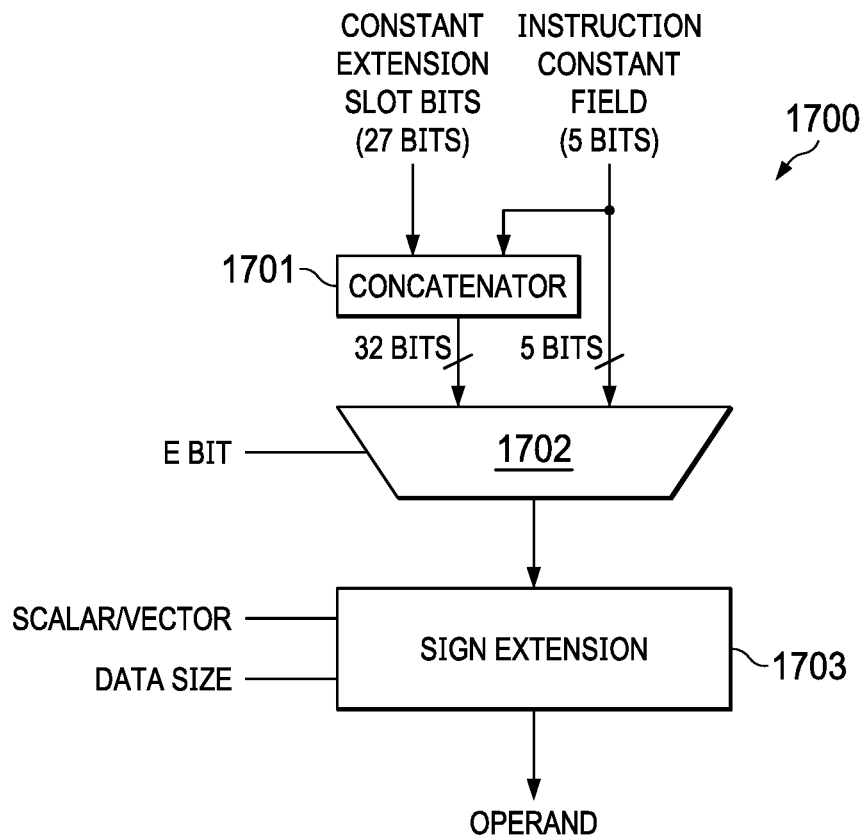
FIG. 17 is a partial block diagram illustrating constant extension.

FIG. 17 is a partial block diagram 1700 illustrating constant extension. FIG. 17 assumes that instruction decoder 113 detects a constant extension slot and a corresponding instruction in the same execute packet. Instruction decoder 113 supplies the 27 extension bits from the constant extension slot (bit field 1601) and the 5 constant bits (bit field 1305) from the corresponding instruction to concatenator 1701. Concatenator 1701 forms a single 32-bit word from these two parts. In the preferred embodiment, the 27 extension bits from the constant extension slot (bit field 1601) are the most significant bits and the 5 constant bits (bit field 1305) are the least significant bits.

This combined 32-bit word is supplied to one input of multiplexer 1702. The 5 constant bits from the corresponding instruction field 1305 supply a second input to multiplexer 1702. Selection of multiplexer 1702 is controlled by the status of the constant extension bit. If the constant extension bit (e bit 1307) is 1 (extended), multiplexer 1702 selects the concatenated 32-bit input. If the constant extension bit is 0 (not extended), multiplexer 1702 selects the 5 constant bits from the corresponding instruction field 1305. Multiplexer 1702 supplies this output to an input of sign extension unit 1703.

Sign extension unit 1703 forms the final operand value from the input from multiplexer 1703. Sign extension unit 1703 receives control inputs Scalar/Vector and Data Size. The Scalar/Vector input indicates whether the corresponding instruction is a scalar instruction or a vector instruction. The functional units of data path side A 115 (L1 unit 221, S1 unit 222, M1 unit 223, N1 unit 224, D1 unit 225 and D2 unit 226) can only perform scalar instructions. Any instruction directed to one of these functional units is a scalar instruction. Data path side B functional units L2 unit 241, S2 unit 242, M2 unit 243, N2 unit 244 and C unit 245 may perform scalar instructions or vector instructions.

Instruction decoder 113 determines whether the instruction is a scalar instruction or a vector instruction from the opcode bits. P unit 246 may only preform scalar instructions. The Data Size may be 8 bits (byte B), 16 bits (half-word H), 32 bits (word W), 64 bits (double word D), quad word (128 bit) data or half vector (256 bit) data.

Table 2 lists the operation of sign extension unit 1703 for the various options.

TABLE 2

| Instruction Type | Operand Size | Constant Length | Action |
|---|---|---|---|
| Scalar | B/H/W/D | 5 bits | Sign extend to 64 bits |
| Scalar | B/H/W/D | 32 bits | Sign extend to 64 bits |
| Vector | B/H/W/D | 5 bits | Sign extend to operand size and replicate across whole vector |
| Vector | B/H/W | 32 bits | Replicate 32-bit constant across each 32-bit (W) lane |
| Vector | D | 32 bits | Sign extend to 64 bits and replicate across each 64-bit (D) lane |

It is feasible for both constant extension slot 0 and constant extension slot 1 to include a p bit to define an execute packet as described above in conjunction with FIG. 13. In the preferred embodiment, as in the case of the condition code extension slots, constant extension slot 0 and constant extension slot 1 preferably have bit 0 (p bit) always encoded as 1. Thus, neither constant extension slot 0 nor constant extension slot 1 can be in the last instruction slot of an execute packet.

It is technically feasible for an execute packet to include a constant extension slot 0 or 1 and more than one corresponding instruction marked constant extended (e bit=1). For constant extension slot 0 this would mean more than one of an L1 unit 221 instruction, data in a D1 unit 225 instruction, an S2 unit 242 instruction, an offset in a D2 unit 226 instruction, an M2 unit 243 instruction or an N2 unit 244 instruction in an execute packet have an e bit of 1. For constant extension slot 1 this would mean more than one of an L2 unit 241 instruction, data in a D2 unit 226 instruction, an S1 unit 222 instruction, an offset in a D1 unit 225 instruction, an M1 unit 223 instruction or an N1 unit 224 instruction in an execute packet have an e bit of 1. Supplying the same constant extension to more than one instruction is not expected to be a useful function. Accordingly, in one embodiment instruction decoder 113 may determine this case an invalid operation and not supported. Alternately, this combination may be supported with extension bits of the constant extension slot applied to each corresponding functional unit instruction marked constant extended.

L1 unit 221, S1 unit 222, L2 unit 241, S2 unit 242 and C unit 245 often operate in a single instruction multiple data (SIMD) mode. In this SIMD mode the same instruction is applied to packed data from the two operands. Each operand holds plural data elements disposed in predetermined slots. SIMD operation is enabled by carry control at the data boundaries. Such carry control enables operations on varying data widths.

Figure 18:
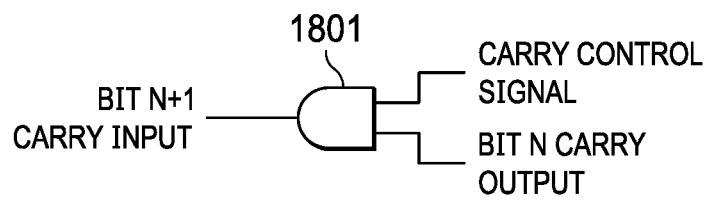
FIG. 18 illustrates the carry control for SIMD operations according to this invention.

FIG. 18 illustrates the carry control. AND gate 1801 receives the carry output of bit N within the operand wide arithmetic logic unit (64 bits for scalar datapath side A 115 functional units and 512 bits for vector datapath side B 116 functional units). AND gate 1801 also receives a carry control signal which will be further explained below. The output of AND gate 1801 is supplied to the carry input of bit N+1 of the operand wide arithmetic logic unit. AND gates such as AND gate 1801 are disposed between every pair of bits at a possible data boundary. For example, for 8-bit data such an AND gate will be between bits 7 and 8, bits 15 and 16, bits 23 and 24, etc. Each such AND gate receives a corresponding carry control signal. If the data size is of the minimum, then each carry control signal is 0, effectively blocking carry transmission between the adjacent bits. The corresponding carry control signal is 1 if the selected data size requires both arithmetic logic unit sections. Table 3 below shows example carry control signals for the case of a 512 bit wide operand such as used by vector datapath side B 116 functional units which may be divided into sections of 8 bits, 16 bits, 32 bits, 64 bits, 128 bits or 256 bits. In Table 3 the upper 32 bits control the upper bits (bits 128 to 511) carries and the lower 32 bits control the lower bits (bits 0 to 127) carries. No control of the carry output of the most significant bit is needed, thus only 63 carry control signals are required.

TABLE 3

| Data Size | Carry Control Signals | | | | | | | |
|---|---|---|---|---|---|---|---|---|
| 8 bits (B) | –000 | 0000 | 0000 | 0000 | 0000 | 0000 | 0000 | 0000 |
|  | 0000 | 0000 | 0000 | 0000 | 0000 | 0000 | 0000 | 0000 |
| 16 bits (H) | –101 | 0101 | 0101 | 0101 | 0101 | 0101 | 0101 | 0101 |
|  | 0101 | 0101 | 0101 | 0101 | 0101 | 0101 | 0101 | 0101 |
| 32 bits (W) | –111 | 0111 | 0111 | 0111 | 0111 | 0111 | 0111 | 0111 |
|  | 0111 | 0111 | 0111 | 0111 | 0111 | 0111 | 0111 | 0111 |
| 64 bits (D) | –111 | 1111 | 0111 | 1111 | 0111 | 1111 | 0111 | 1111 |
|  | 0111 | 1111 | 0111 | 1111 | 0111 | 1111 | 0111 | 1111 |
| 128 bits | –111 | 1111 | 1111 | 1111 | 0111 | 1111 | 1111 | 1111 |
|  | 0111 | 1111 | 1111 | 1111 | 0111 | 1111 | 1111 | 1111 |
| 256 bits | –111 | 1111 | 1111 | 1111 | 1111 | 1111 | 1111 | 1111 |
|  | 0111 | 1111 | 1111 | 1111 | 1111 | 1111 | 1111 | 1111 |

It is typical in the art to operate on data sizes that are integral powers of 2 ($2^N$). However, this carry control technique is not limited to integral powers of 2. One skilled in the art would understand how to apply this technique to other data sizes and other operand widths.

In the preferred embodiment, at least L unit 241 and S unit 242 employ two types of SIMD instructions using registers in predicate register file 234. In the preferred embodiment, all these SIMD vector predicate instructions operate on an instruction specified data size. The data sizes may include byte (8 bit) data, half word (16 bit) data, word (32 bit) data, double word (64 bit) data, quad word (128 bit) data and half vector (256 bit) data. In the first of these instruction types, the functional unit (L unit 241 or S unit 242) performs a SIMD comparison on packed data in two general data registers and supplies results to a predicate data register. The instruction specifies a data size, the two general data register operands and the destination predicate register. In the preferred embodiment, each predicate data register includes one bit corresponding to each minimal data size portion of the general data registers. In the current embodiment, the general data registers are 512 bits (64 bytes) and the predicate data registers are 64 bits (8 bytes). Each bit of a predicate data register corresponds to 8 bits of a general data register. The comparison is performed on a specified data size (8, 16, 32, 64, 128 or 256 bits). If the comparison is true then the functional unit supplies 1's to all predicate register bits corresponding the that data size portion. If the comparison is false then the functional unit supplies 0's to all predicate register bits corresponding to that data size portion. In the preferred embodiment, the enabled comparison operations include: less than; greater than; and equal to.

In the second of these instruction types, the functional unit (L unit 241 or S unit 242) separately performs a first SIMD operation or a second SIMD operation on packed data in general data registers based upon the state of data in a predicate data register. The instruction specifies a data size, one or two general data register operands, a controlling predicate register and a general data register destination. For example a functional unit may select, for each data sized portion of two vector operands, a first data element of a first operand or a second data element of a second operand dependent upon the 1/0 state of correspond bits in the predicate data register to store in the destination register. In a second example, the data elements of a single vector operand may be saved to memory or not saved dependent upon the data of the corresponding bits of the predicate register.

The operations of P unit 245 permit a variety of compound vector SIMD operations based upon more than one vector comparison. For example, a range determination can be made using two comparisons. In a SIMD operation a candidate vector is compared with a first vector reference having the minimum of the range packed within a first data register. The greater than result is scalar data with bits corresponding to the SIMD data width set to 0 or 1 depending upon the SIMD comparison. This is stored in a first predicate data register. A second SIMD comparison of the candidate vector is made with a second reference vector having the maximum of the range packed within a second data register produces another scalar with less than results stored in a second predicate register. The P unit then ANDs the first and second predicate registers. The AND result indicates whether each SIMD data part of the candidate vector is within range or out of range. A P unit BITCNT instruction of the AND result could produce a count of the data elements within the comparison range. The P unit NEG function may be used to convert: a less than comparison result to a greater than or equal comparison result; a greater than comparison result to a less than or equal to comparison result; or an equal to comparison result to a not equal to comparison result.

Figure 19:
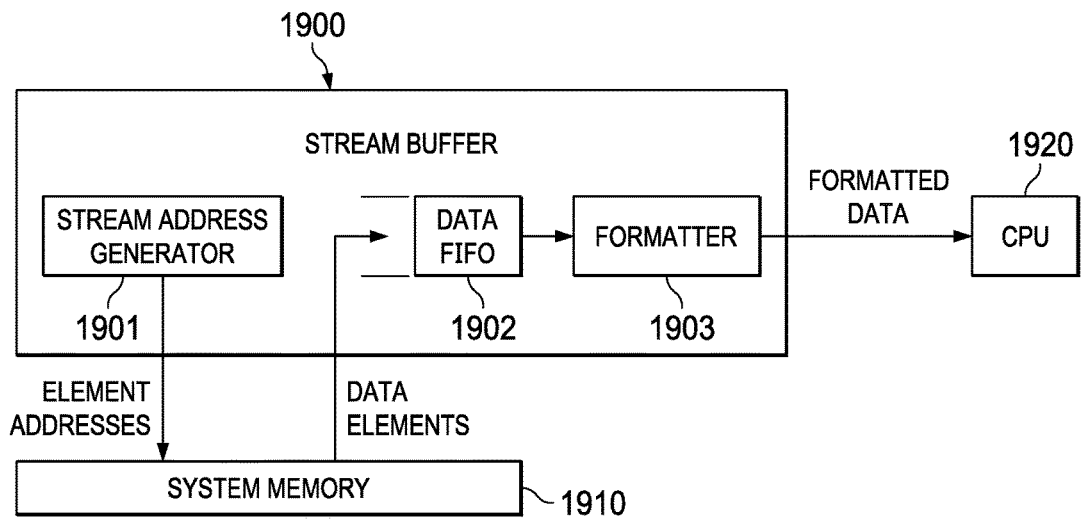
FIG. 19 illustrates a conceptual view of the streaming engines of this invention.

FIG. 19 illustrates a conceptual view of the streaming engines of this invention. FIG. 19 illustrates the process of a single stream. Streaming engine 1900 includes stream address generator 1901. Stream address generator 1901 sequentially generates addresses of the elements of the stream and supplies these element addresses to system memory 1910. Memory 1910 recalls data stored at the element addresses (data elements) and supplies these data elements to data first-in-first-out (FIFO) memory 1902. Data FIFO 1902 provides buffering between memory 1910 and CPU 1920. Data formatter 1903 receives the data elements from data FIFO memory 1902 and provides data formatting according to the stream definition. This process will be described below. Streaming engine 1900 supplies the formatted data elements from data formatter 1903 to the CPU 1920. The program on CPU 1920 consumes the data and generates an output.

Stream elements typically reside in normal memory. The memory itself imposes no particular structure upon the stream. Programs define streams and therefore impose structure, by specifying the following stream attributes: address of the first element of the stream; size and type of the elements in the stream; formatting for data in the stream; and the address sequence associated with the stream.

The streaming engine defines an address sequence for elements of the stream in terms of a pointer walking through memory. A multiple-level nested loop controls the path the pointer takes. An iteration count for a loop level indicates the number of times that level repeats. A dimension gives the distance between pointer positions of that loop level.

In a basic forward stream, the innermost loop always consumes physically contiguous elements from memory. The implicit dimension of this innermost loop is 1 element. The pointer itself moves from element to element in consecutive, increasing order. In each level outside the inner loop, that loop moves the pointer to a new location based on the size of that loop level's dimension.

This form of addressing allows programs to specify regular paths through memory in a small number of parameters. Table 4 lists the addressing parameters of a basic stream.

TABLE 4

| Parameter | Definition |
| --- | --- |
| ELEM_BYTES | Size of each element in bytes |
| ICNT0 | Number of iterations for the innermost loop level 0. At loop level 0 all elements are physically contiguous DIM0 is ELEM_BYTES |
| ICNT1 | Number of iterations for loop level 1 |
| DIM1 | Number of bytes between the starting points for consecutive iterations of loop level 1 |
| ICNT2 | Number of iterations for loop level 2 |
| DIM2 | Number of bytes between the starting points for consecutive iterations of loop level 2 |
| ICNT3 | Number of iterations for loop level 3 |
| DIM3 | Number of bytes between the starting points for consecutive iterations of loop level 3 |
| ICNT4 | Number of iterations for loop level 4 |
| DIM4 | Number of bytes between the starting points for consecutive iterations of loop level 4 |
| ICNT5 | Number of iterations for loop level 5 |
| DIM5 | Number of bytes between the starting points for consecutive iterations of loop level 5 |

In accordance with the preferred embodiment of this invention ELEM_BYTES ranges from 1 to 64 bytes as shown in Table 5.

TABLE 5

| ELEM_BYTES | Stream Element Length |
| --- | --- |
| 000 | 1 byte |
| 001 | 2 bytes |
| 010 | 4 bytes |
| 011 | 8 bytes |
| 100 | 16 bytes |
| 101 | 32 bytes |
| 110 | 64 bytes |
| 111 | Reserved |

The definition above maps consecutive elements of the stream to increasing addresses in memory. This works well for most algorithms but not all. Some algorithms are better served by reading elements in decreasing memory addresses, reverse stream addressing. For example, a discrete convolution computes vector dot-products, as per the formula:

$$(f,g)[t] = \sum_{x=-\infty}^{\infty} f[x]g[t-x]$$

In most DSP code, f[ ] and g[ ] represent arrays in memory. For each output, the algorithm reads f[ ] in the forward direction, but reads g[ ] in the reverse direction. Practical filters limit the range of indices for [x] and [t−x] to a finite number elements. To support this pattern, the streaming engine supports reading elements in decreasing address order.

Matrix multiplication presents a unique problem to the streaming engine. Each element in the matrix product is a vector dot product between a row from the first matrix and a column from the second. Programs typically store matrices all in row-major or column-major order. Row-major order stores all the elements of a single row contiguously in memory. Column-major order stores all elements of a single column contiguously in memory. Matrices typically get stored in the same order as the default array order for the language. As a result, only one of the two matrices in a matrix multiplication map on to the streaming engine's 2-dimensional stream definition. In a typical example a first index steps through columns on array first array but rows on second array. This problem is not unique to the streaming engine. Matrix multiplication's access pattern fits poorly with most general-purpose memory hierarchies. Some software libraries transposed one of the two matrices, so that both get accessed row-wise (or column-wise) during multiplication. The streaming engine supports implicit matrix transposition with transposed streams. Transposed streams avoid the cost of explicitly transforming the data in memory. Instead of accessing data in strictly consecutive-element order, the streaming engine effectively interchanges the inner two loop dimensions in its traversal order, fetching elements along the second dimension into contiguous vector lanes.

This algorithm works, but is impractical to implement for small element sizes. Some algorithms work on matrix tiles which are multiple columns and rows together. Therefore, the streaming engine defines a separate transposition granularity. The hardware imposes a minimum granularity. The transpose granularity must also be at least as large as the element size. Transposition granularity causes the streaming engine to fetch one or more consecutive elements from dimension 0 before moving along dimension 1. When the granularity equals the element size, this results in fetching a single column from a row-major array. Otherwise, the granularity specifies fetching 2, 4 or more columns at a time from a row-major array. This is also applicable for column-major layout by exchanging row and column in the description. A parameter GRANULE indicates the transposition granularity in bytes.

Another common matrix multiplication technique exchanges the innermost two loops of the matrix multiply. The resulting inner loop no longer reads down the column of one matrix while reading across the row of another. For example, the algorithm may hoist one term outside the inner loop, replacing it with the scalar value. On a vector machine, the innermost loop can be implements very efficiently with a single scalar-by-vector multiply followed by a vector add. The central processing unit core 110 of this invention lacks a scalar-by-vector multiply. Programs must instead duplicate the scalar value across the length of the vector and use a vector-by-vector multiply. The streaming engine of this invention directly supports this and related use models with an element duplication mode. In this mode, the streaming engine reads a granule smaller than the full vector size and replicates that granule to fill the next vector output.

The streaming engine treats each complex number as a single element with two sub-elements that give the real and imaginary (rectangular) or magnitude and angle (polar) portions of the complex number. Not all programs or peripherals agree what order these sub-elements should appear in memory. Therefore, the streaming engine offers the ability to swap the two sub-elements of a complex number with no cost. This feature swaps the halves of an element without interpreting the contents of the element and can be used to swap pairs of sub-elements of any type, not just complex numbers.

Algorithms generally prefer to work at high precision, but high precision values require more storage and bandwidth than lower precision values. Commonly, programs will store data in memory at low precision, promote those values to a higher precision for calculation and then demote the values to lower precision for storage. The streaming engine supports this directly by allowing algorithms to specify one level of type promotion. In the preferred embodiment of this invention every sub-element may be promoted to a larger type size with either sign or zero extension for integer types. It is also feasible that the streaming engine may support floating point promotion, promoting 16-bit and 32-bit floating point values to 32-bit and 64-bit formats, respectively.

The streaming engine defines a stream as a discrete sequence of data elements, the central processing unit core 110 consumes data elements packed contiguously in vectors. Vectors resemble streams in as much as they contain multiple homogeneous elements with some implicit sequence. Because the streaming engine reads streams, but the central processing unit core 110 consumes vectors, the streaming engine must map streams onto vectors in a consistent way.

Vectors consist of equal-sized lanes, each lane containing a sub-element. The central processing unit core 110 designates the rightmost lane of the vector as lane 0, regardless of device's current endian mode. Lane numbers increase right-to-left. The actual number of lanes within a vector varies depending on the length of the vector and the data size of the sub-element.

Figure 20:
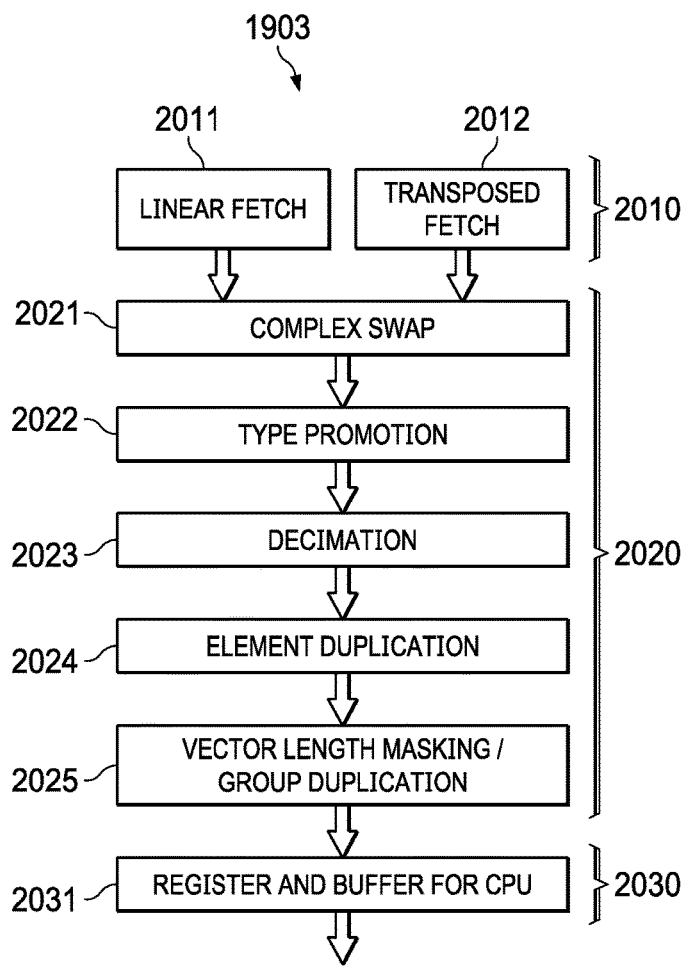
FIG. 20 illustrates the sequence of the formatting operations of this invention.

FIG. 20 illustrates the sequence of the formatting operations of formatter 1903. Formatter 1903 includes three sections: input section 2010; formatting section 2020; and output section 2030. Input section 2010 receives the data recalled from system memory 1910 as accessed by stream address generator 1901. This data could be via linear fetch stream 2011 or transposed fetch stream 2012.

Formatting section 2020 includes various formatting blocks. The formatting performed by formatter 1903 by these blocks will be further described below. Complex swap block 2021 optionally swaps two sub-elements forming a complex number element. Type promotion block 2022 optionally promotes each data element into a larger data size. Promotion includes zero extension for unsigned integers and sign extension for signed integers. Decimation block 2023 optionally decimates the data elements. In the preferred embodiment decimation can be 2:1 retaining every other data element or 4:1 retaining every fourth data element. Element duplication block 2024 optionally duplicates individual data elements. In the preferred embodiment, this data element duplication is an integer power of 2 ($2^N$, when N is an integer) including 2×, 4×, 8×, 16×, 32× and 64×. In the preferred embodiment data duplication can extend over plural destination vectors. Vector length masking/group duplication block 2025 has two primary functions. An independently specified vector length VECLEN controls the data elements supplied to each output data vector. When group duplication is off, excess lanes in the output data vector are zero filled and these lanes are marked invalid. When group duplication is on, input data elements of the specified vector length are duplicated to fill the output data vector.

Output section 2030 holds the data for output to the corresponding functional units. Register and buffer for CPU 2031 stores a formatted vector of data to be used as an operand by the functional units of central processing unit core 110.

FIG. 21 illustrates a first example of lane allocation in a vector. Vector 2100 is divided into 8 64-bit lanes (8×64 bits=512 bits the vector length). Lane 0 includes bits 0 to 63; line 1 includes bits 64 to 125; lane 2 includes bits 128 to 191; lane 3 includes bits 192 to 255, lane 4 includes bits 256 to 319, lane 5 includes bits 320 to 383, lane 6 includes bits 384 to 447 and lane 7 includes bits 448 to 511.

FIG. 22 illustrates a second example of lane allocation in a vector. Vector 2210 is divided into 16 32-bit lanes (16×32 bits=512 bits the vector length). Lane 0 includes bits 0 to 31; line 1 includes bits 32 to 63; lane 2 includes bits 64 to 95; lane 3 includes bits 96 to 127; lane 4 includes bits 128 to 159; lane 5 includes bits 160 to 191; lane 6 includes bits 192 to 223; lane 7 includes bits 224 to 255; lane 8 includes bits 256 to 287; line 9 occupied bits 288 to 319; lane 10 includes bits 320 to 351; lane 11 includes bits 352 to 387; lane 12 includes bits 388 to 415; lane 13 includes bits 416 to 447; lane 14 includes bits 448 to 479; and lane 15 includes bits 480 to 511.

The streaming engine maps the innermost stream dimension directly to vector lanes. It maps earlier elements within that dimension to lower lane numbers and later elements to higher lane numbers. This is true regardless of whether this particular stream advances in increasing or decreasing address order. Whatever order the stream defines, the streaming engine deposits elements in vectors in increasing-lane order. For non-complex data, it places the first element in lane 0 of the first vector central processing unit core 110 fetches, the second in lane 1, and so on. For complex data, the streaming engine places the first element in lanes 0 and 1, second in lanes 2 and 3, and so on. Sub-elements within an element retain the same relative ordering regardless of the stream direction. For non-swapped complex elements, this places the sub-elements with the lower address of each pair in the even numbered lanes, and the sub-elements with the higher address of each pair in the odd numbered lanes. Swapped complex elements reverse this mapping.

The streaming engine fills each vector central processing unit core 110 fetches with as many elements as it can from the innermost stream dimension. If the innermost dimension is not a multiple of the vector length, the streaming engine pads that dimension out to the vector length with zeros. As noted below the streaming engine will also mark these lanes invalid. Thus for higher-dimension streams, the first element from each iteration of an outer dimension arrives in lane 0 of a vector. The streaming engine always maps the innermost dimension to consecutive lanes in a vector. For transposed streams, the innermost dimension consists of groups of sub-elements along dimension 1, not dimension 0, as transposition exchanges these two dimensions.

Two dimensional streams exhibit greater variety as compared to one dimensional streams. A basic two dimensional stream extracts a smaller rectangle from a larger rectangle. A transposed 2-D stream reads a rectangle column-wise instead of row-wise. A looping stream, where the second dimension overlaps first executes a finite impulse response (FIR) filter taps which loops repeatedly or FIR filter samples which provide a sliding window of input samples.

Figure 23:
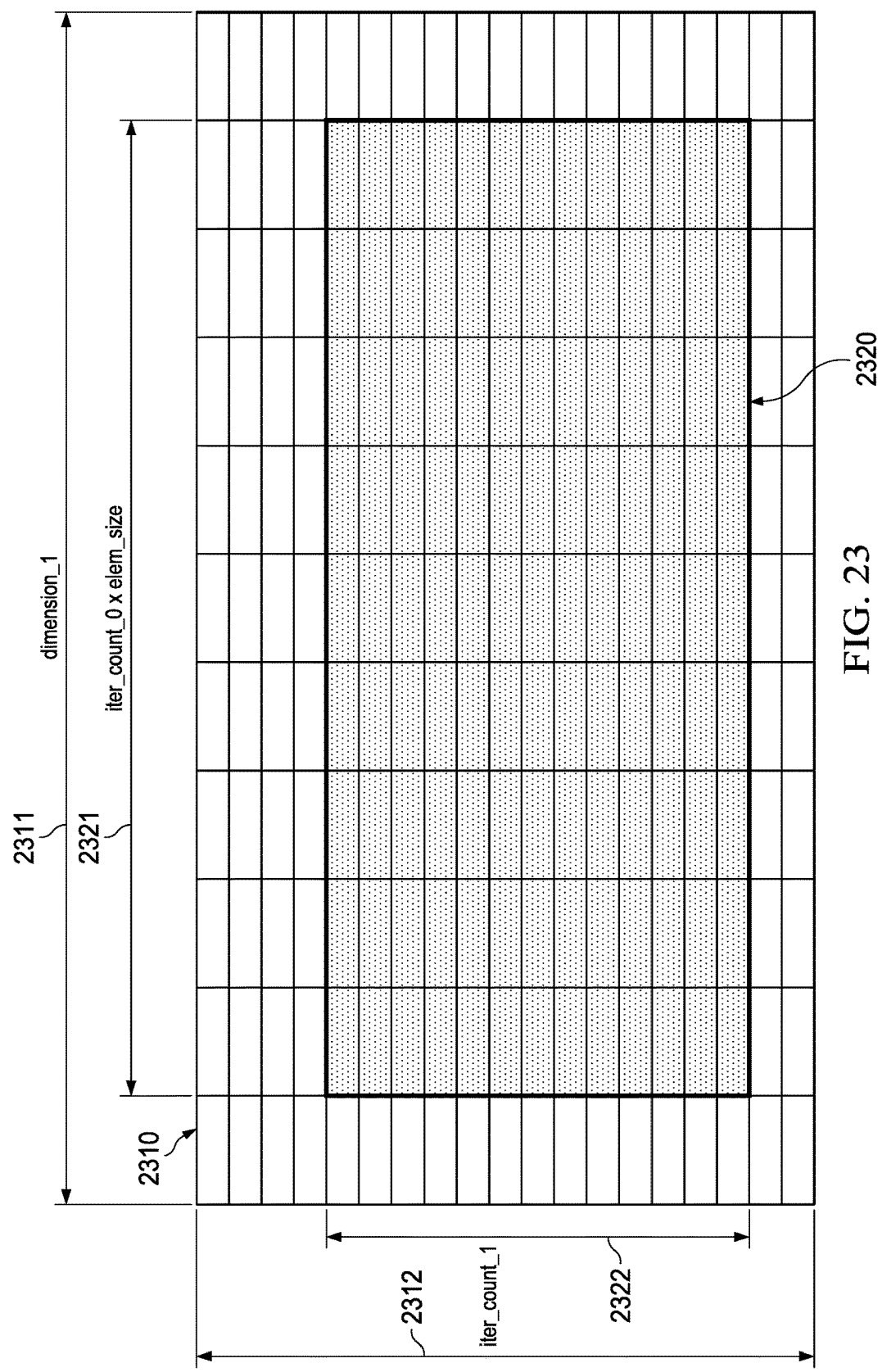
FIG. 23 illustrates a basic two dimensional stream.

FIG. 23 illustrates a basic two dimensional stream. The inner two dimensions, represented by ELEM_BYTES, ICNT0, DIM1 and ICNT1 give sufficient flexibility to describe extracting a smaller rectangle 2320 having dimensions 2321 and 2322 from a larger rectangle 2310 having dimensions 2311 and 2312. In this example rectangle 2320 is a 9 by 13 rectangle of 64-bit values and rectangle 2310 is a larger 11 by 19 rectangle. The following stream parameters define this stream:

ICNT0=9
ELEM_BYTES=8
ICNT1=13
DIM1=88 (11 times 8)

Thus, the iteration count in the 0 dimension 2321 is 9. The iteration count in the 1 direction 2322 Note that the ELEM_BYTES only scales the innermost dimension. The first dimension has ICNT0 elements of size ELEM_BYTES. The stream address generator does not scale the outer dimensions. Therefore, DIM1=88, which is 11 elements scaled by 8 bytes per element.

Figure 24:
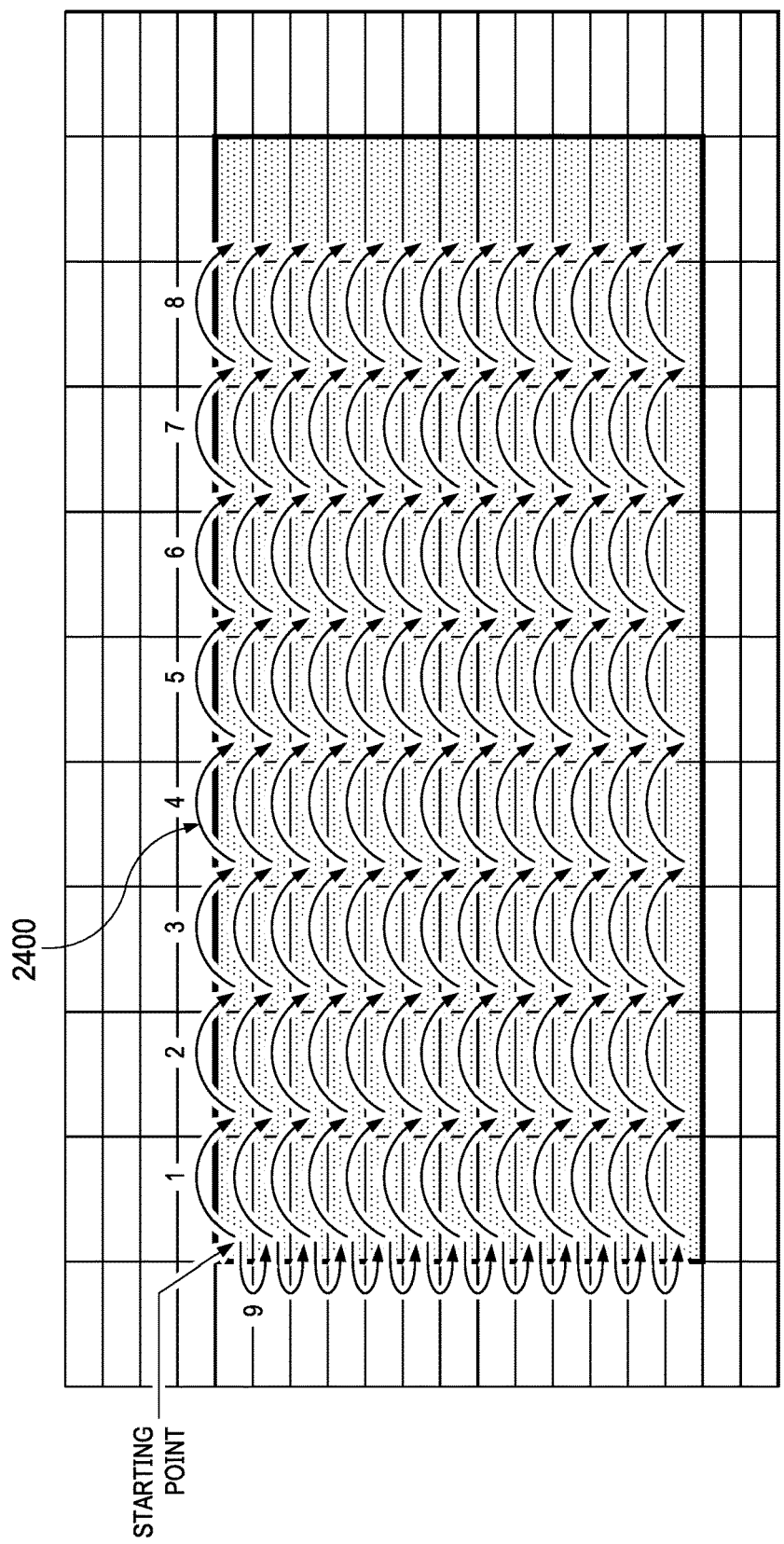
FIG. 24 illustrates the order of elements within the example stream of FIG. 23.

FIG. 24 illustrates the order of elements within this example stream. The streaming engine fetches elements for the stream in the order illustrated in order 2400. The first 9 elements come from the first row of rectangle 2320, left-to-right in hops 1 to 8. The 10th through 24th elements comes from the second row, and so on. When the stream moves from the 9th element to the 10th element (hop 9 in FIG. 24), the streaming engine computes the new location based on the pointer's position at the start of the inner loop, not where the pointer ended up at the end of the first dimension. This makes DIM1 independent of ELEM_BYTES and ICNT0. DIM1 always represents the distance between the first bytes of each consecutive row.

Figure 25:
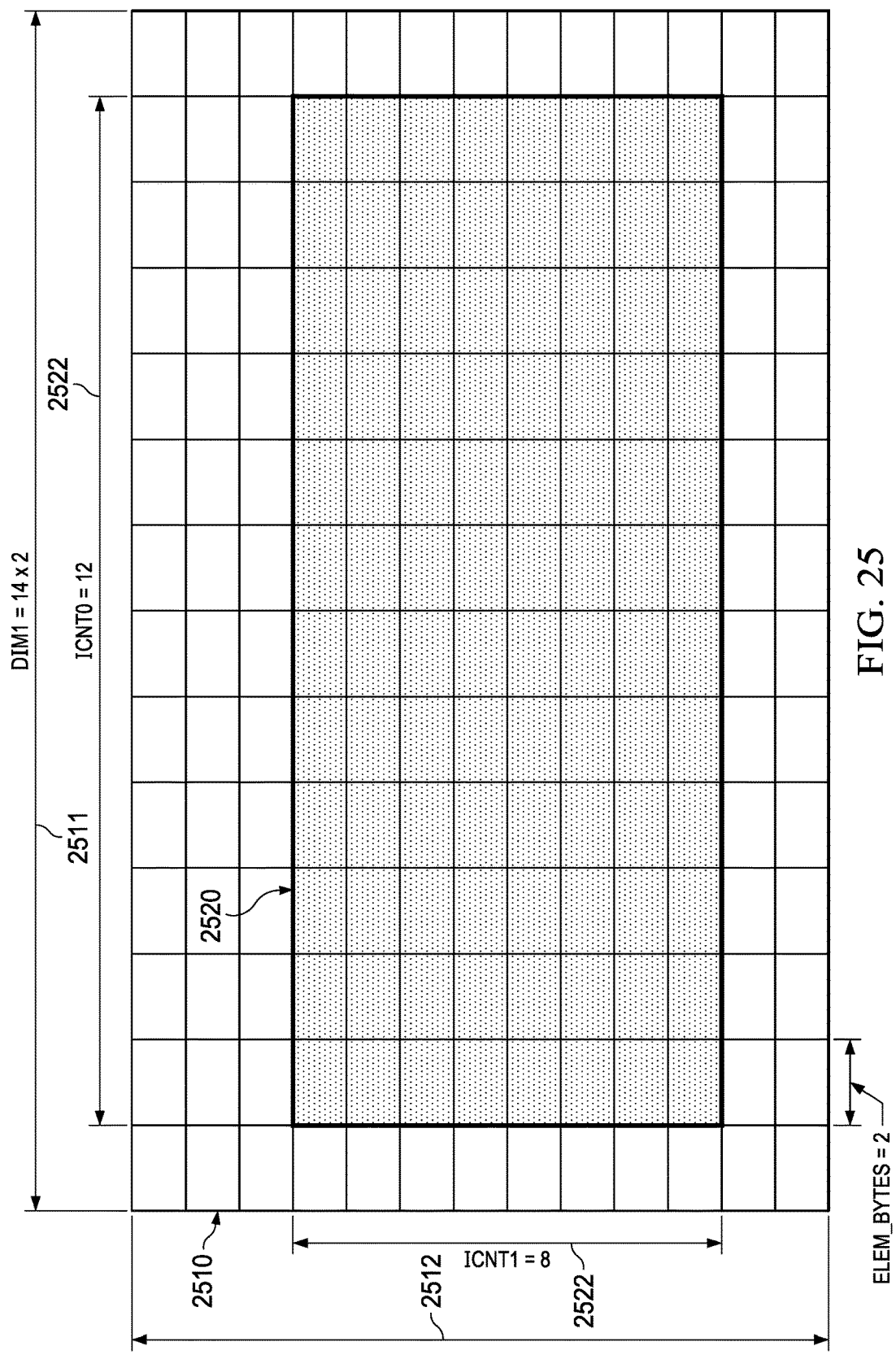
FIG. 25 illustrates extracting a smaller rectangle from a larger rectangle.

Transposed streams access along dimension 1 before dimension 0. The following examples illustrate a couple transposed streams, varying the transposition granularity. FIG. 25 illustrates extracting a smaller rectangle 2520 (12× 8) having dimensions 2521 and 2522 from a larger rectangle 2510 (14×13) having dimensions 2511 and 2512. In FIG. 25 ELEM_BYTES equal 2.

Figure 26:
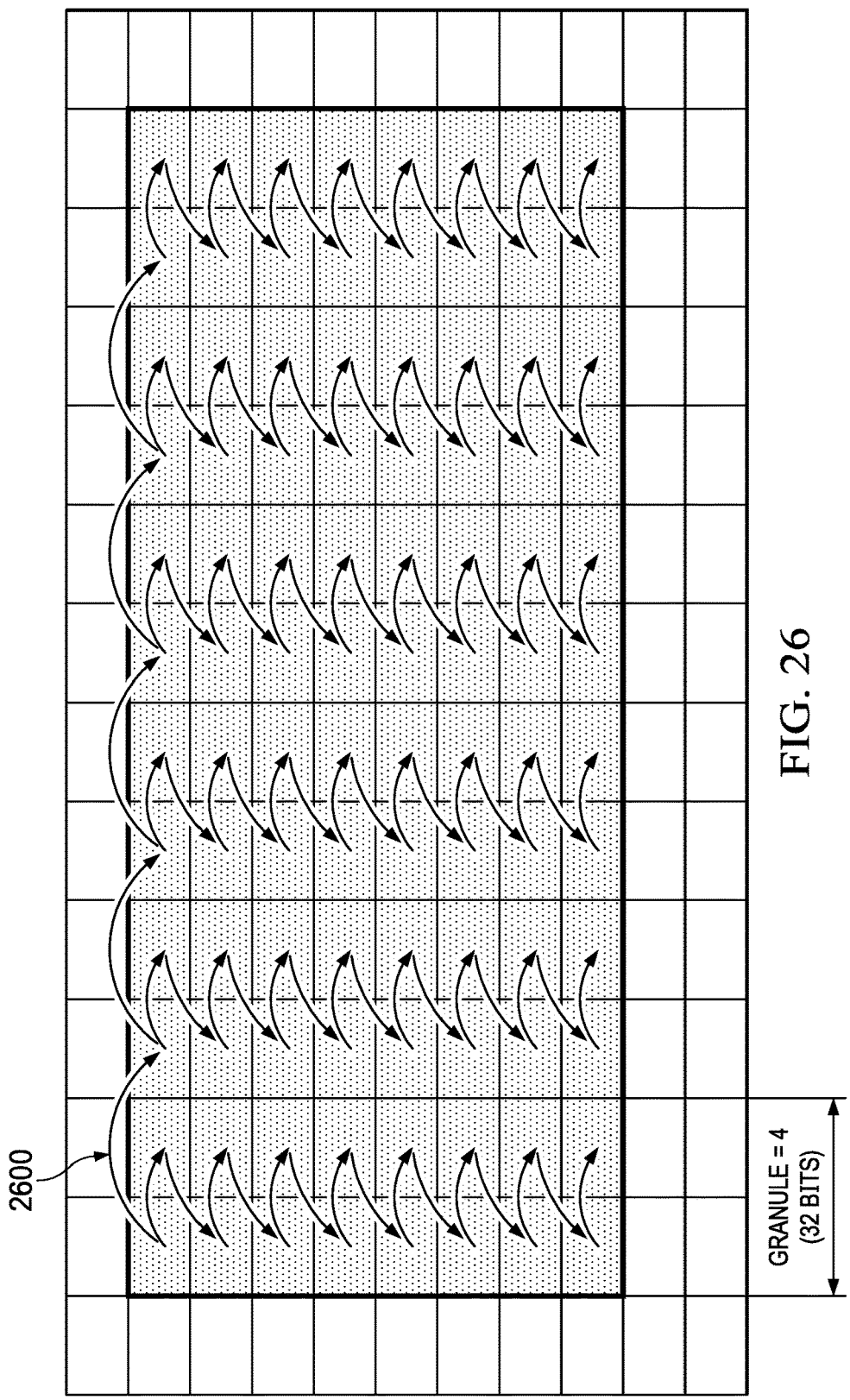
FIG. 26 illustrates how the streaming engine would fetch the stream of this example with a transposition granularity of 4 bytes.

FIG. 26 illustrates how the streaming engine would fetch the stream of this example with a transposition granularity of 4 bytes. Fetch pattern 2600 fetches pairs of elements from each row (because the granularity of 4 is twice the ELEM_BYTES of 2), but otherwise moves down the columns. Once it reaches the bottom of a pair of columns, it repeats this pattern with the next pair of columns.

Figure 27:
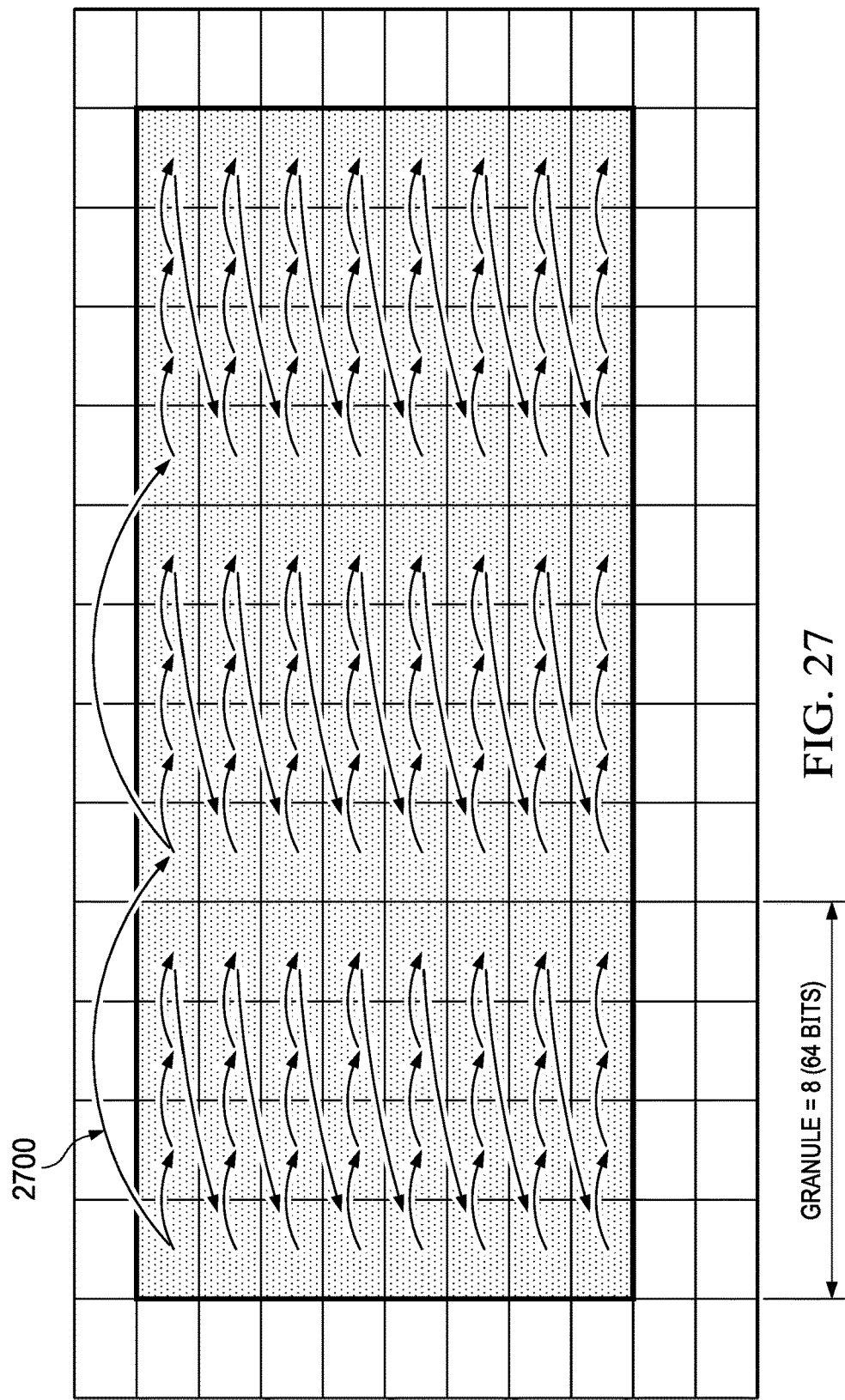
FIG. 27 illustrates how the streaming engine would fetch the stream of this example with a transposition granularity of 8 bytes.

FIG. 27 illustrates how the streaming engine would fetch the stream of this example with a transposition granularity of 8 bytes. The overall structure remains the same. The streaming engine fetches 4 elements from each row (because the granularity of 8 is four times the ELEM_BYTES of 2) before moving to the next row in the column as shown in fetch pattern 2700.

The streams examined so far read each element from memory exactly once. A stream can read a given element from memory multiple times, in effect looping over a piece of memory. FIR filters exhibit two common looping patterns. FIRs re-read the same filter taps for each output. FIRs also read input samples from a sliding window. Two consecutive outputs will need inputs from two overlapping windows.

Figure 28:
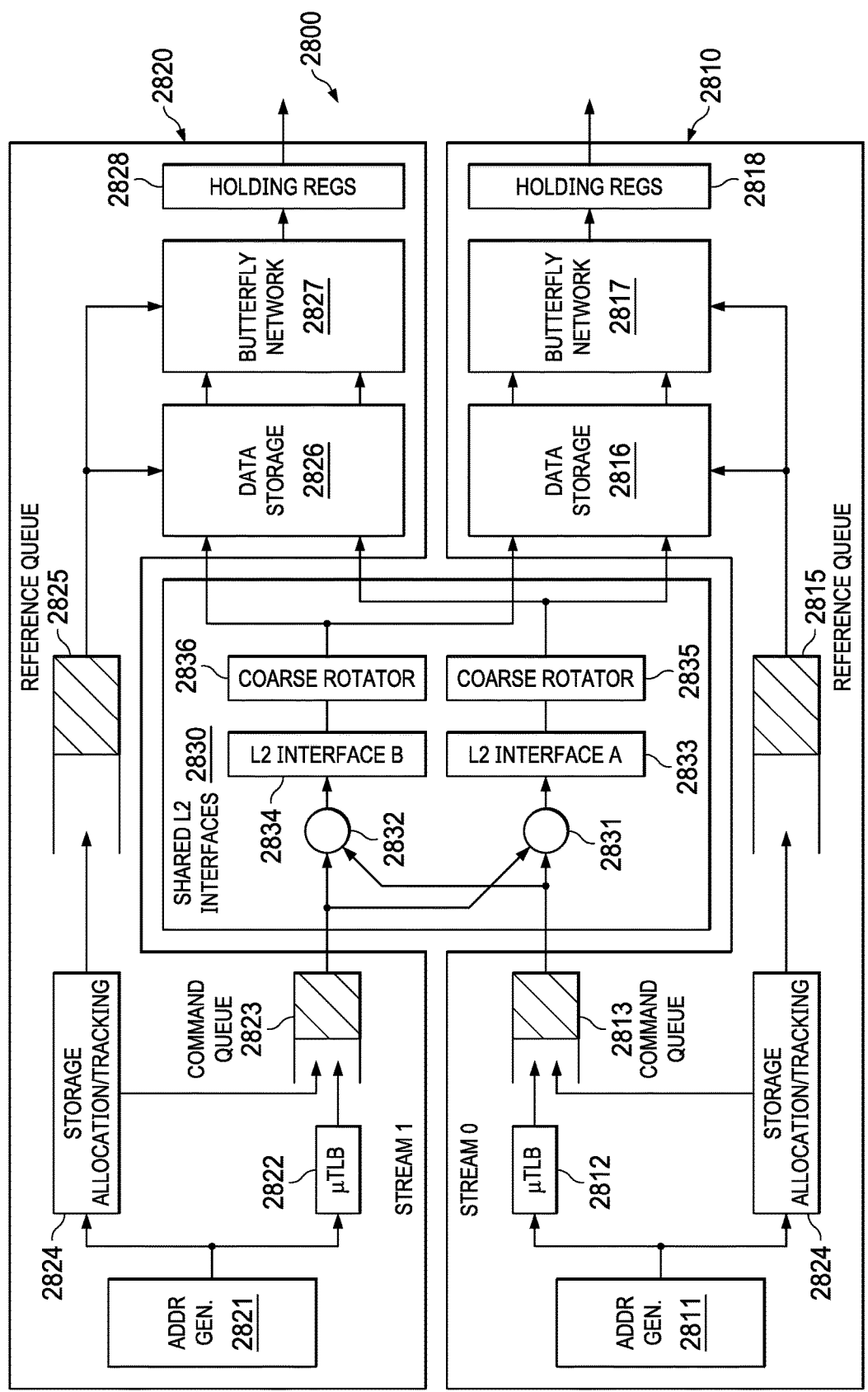
FIG. 28 illustrates the details of streaming engine of this invention.

FIG. 28 illustrates the details of streaming engine 2800. Streaming engine 2800 contains three major sections: Stream 0 2810; Stream 1 2820; and Shared L2 Interfaces 2830. Stream 0 2810 and Stream 1 2820 both contain identical hardware that operates in parallel. Stream 0 2810 and Stream 1 2820 both share L2 interfaces 2830. Each stream 2810 and 2820 provides central processing unit core 110 with up to 512 bits/cycle, every cycle. The streaming engine architecture enables this through its dedicated stream paths and shared dual L2 interfaces.

Each streaming engine 2800 includes a dedicated 6-dimensional stream address generator 2811/2821 that can each generate one new non-aligned request per cycle. Address generators 2811/2821 output 512-bit aligned addresses that overlap the elements in the sequence defined by the stream parameters. This will be further described below.

Each address generator 2811/2811 connects to a dedicated micro table look-aside buffer (µTLB) 2812/2822. The µTLB 2812/2822 converts a single 48-bit virtual address to a 44-bit physical address each cycle. Each µTLB 2812/2822 has 8 entries, covering a minimum of 32 kB with 4 kB pages or a maximum of 16 MB with 2 MB pages. Each address generator 2811/2821 generates 2 addresses per cycle. The µTLB 2812/2822 only translates 1 address per cycle. To maintain throughput, streaming engine 2800 takes advantage of the fact that most stream references will be within the same 4 kB page. Thus, the address translation does not modify bits 0 to 11 of the address. If aout0 and aout1 line in the same 4 kB page (aout0[47:12] are the same aout1[47:12]), then the µTLB 2812/2822 only translates aout0 and reuses the translation for the upper bits of both addresses.

Translated addresses are queued in command queue 2813/2823. These addresses are aligned with information from the corresponding Storage Allocation and Tracking block 2814/2824. Streaming engine 2800 does not explicitly manage µTLB 2812/2822. The system memory management unit (MMU) invalidates µTLBs as necessary during context switches.

Storage Allocation and Tracking 2814/2824 manages the stream's internal storage, discovering data reuse and tracking the lifetime of each piece of data. This will be further described below.

Reference queue 2815/2825 stores the sequence of references generated by the corresponding address generator 2811/2821. This information drives the data formatting network so that it can present data to central processing unit core 110 in the correct order. Each entry in reference queue 2815/2825 contains the information necessary to read data out of the data store and align it for central processing unit core 110. Reference queue 2815/2825 maintains the following information listed in Table 6 in each slot:

TABLE 6

| Data Slot Low | Slot number for the lower half of data associated with aout0 |
| Data Slot High | Slot number for the upper half of data associated with aout1 |
| Rotation | Number of bytes to rotate data to align next element with lane 0 |
| Length | Number of valid bytes in this reference |

Storage allocation and tracking 2814/2824 inserts references in reference queue 2815/2825 as address generator 2811/2821 generates new addresses. Storage allocation and tracking 2814/2824 removes references from reference queue 2815/2825 when the data becomes available and there is room in the stream head registers. As storage allocation and tracking 2814/2824 removes slot references from reference queue 2815/2825 and formats data, it checks whether the references represent the last reference to the corresponding slots. Storage allocation and tracking 2814/2824 compares reference queue 2815/2825 removal pointer against the slot's recorded Last Reference. If they match, then storage allocation and tracking 2814/2824 marks the slot inactive once it's done with the data.

Streaming engine 2800 has data storage 2816/2826 for an arbitrary number of elements. Deep buffering allows the streaming engine to fetch far ahead in the stream, hiding memory system latency. The right amount of buffering might vary from product generation to generation. In the current preferred embodiment streaming engine 2800 dedicates 32 slots to each stream. Each slot holds 64 bytes of data.

Butterfly network 2817/2827 consists of a 7 layer butterfly network. Butterfly network 2817/2827 receives 64 bytes of input and generates 64 bytes of output. The first layer of the butterfly is actually a half-stage. It collects bytes from both slots that match a non-aligned fetch and merges them into a single, rotated 64-byte array. The remaining 6 layers form a standard butterfly network. Butterfly network 2817/2827 performs the following operations: rotates the next element down to byte lane 0; promotes data types by a power of 2, if requested; swaps real and imaginary components of complex numbers, if requested; converts big endian to little endian if central processing unit core 110 is presently in big endian mode. The user specifies element size, type promotion and real/imaginary swap as part of the stream's parameters.

Butterfly networks can achieve various transformations from input to output data from relatively simple hardware (one 2×1 mux per element for each layer), however the control of these MUX elements for each pattern is complicated and can involve a large amount of storage. A simple combinational logic method is shown to generate the controls required by a butterfly network to implement a plurality of alignments of the input data.

Figure 35:
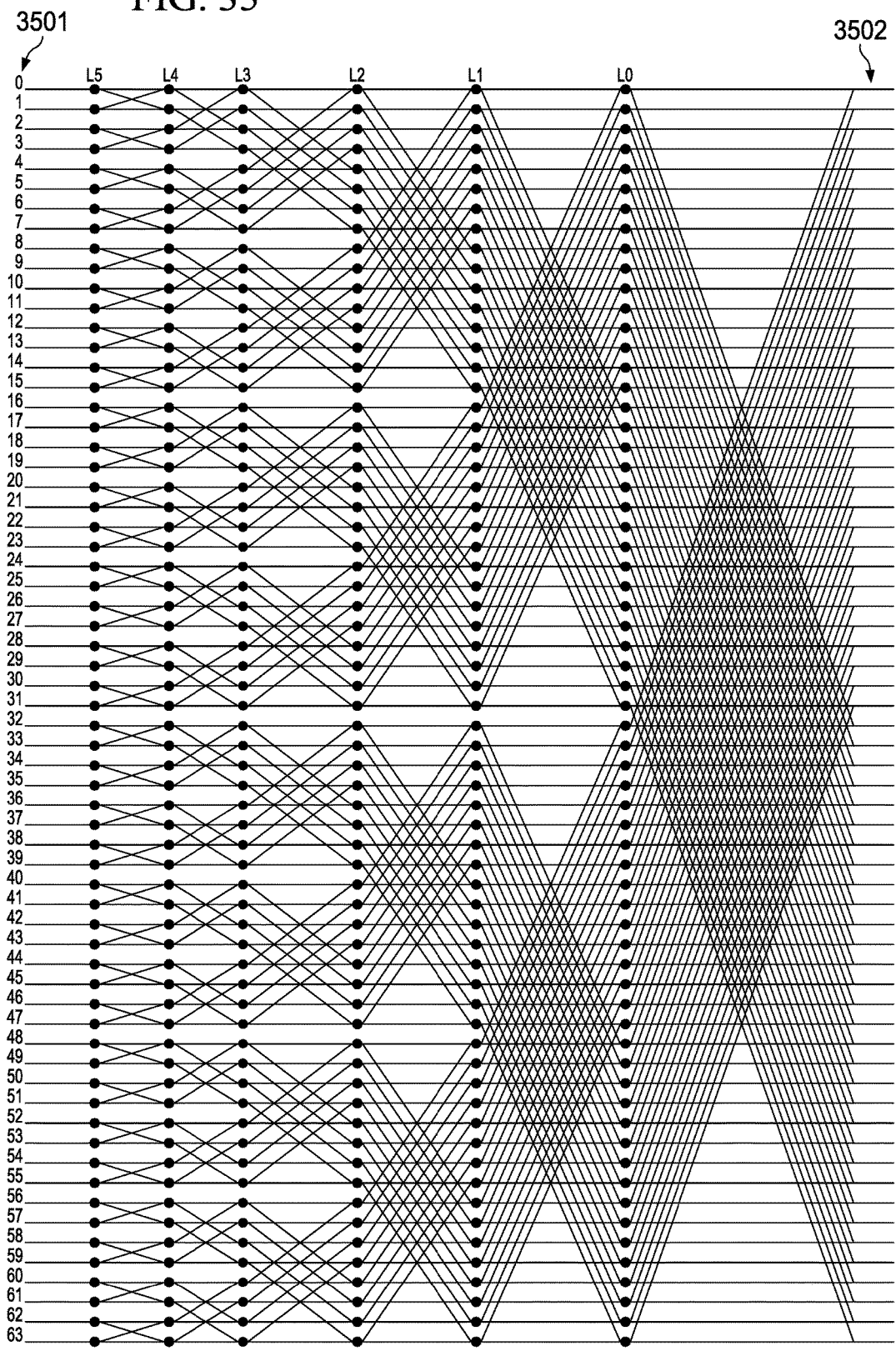
FIG. 35 shows an inverse butterfly network.

For additional flexibility the butterfly network may also be constructed as an inverse butterfly network, shown in FIG. 35. In the inverse butterfly network, the data flow is reversed, with input 3101 becoming output 3502, and output 3108 becoming input 3501.

Figure 31:
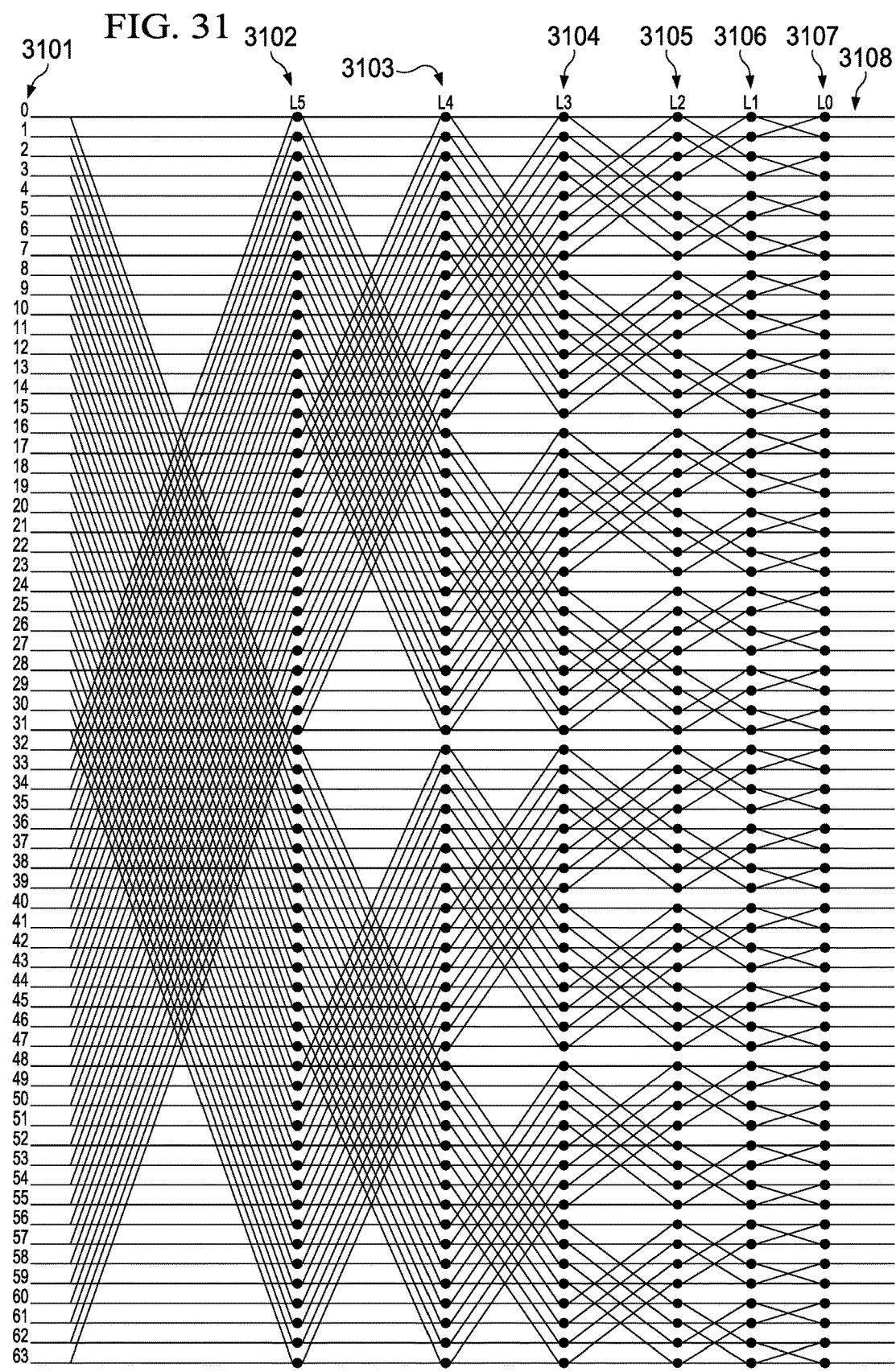
FIG. 31 illustrates an implementation of the butterfly network described in this invention.

FIG. 31 shows an implementation 3100 of a 64 section butterfly network. Input data 3101 can be transformed by the 6 layer butterfly network 3100 with outputs 3108. Layer L5 (3102) consists of 64 2×1 multiplexers, arranged in a 2×32 format. Layer L4 (3103) consists of 64 2×1 multiplexers, arranged in a 4×16 format. Layer L3 (3104) consists of 64 2×1 multiplexers arranged in an 8×8 format. Layer L2 (3105) consists of 64 2×1 multiplexers arranged in a 4×16 format, and layer L1 (3106) also consists of 64 2×1 multiplexers arranged in a 2×32 format. Final layer L0 (3107) also consists of 64 2×1 multiplexers and select the last section of the output data word. In a generalized case if the data width is n, (where n is an integral power of 2) one layer is needed for each section of the data width, with n 2×1 multiplexers in each layer.

In FIG. 31 the number of sections n is 64, therefore 6 butterfly layers are required ($\log_2(64)=6$). Each layer consists of 64 2×1 multiplexers. Each layer is connected to outputs of multiplexers of prior layers as follows. Input data (3101) sections 0 to 63 are connected to the first input (input 0) of corresponding multiplexers in layer L5 3102. For all subsequent layers (layer L4 3103, layer L3 3104, layer L2 3105, layer L1 3106 and layer L0 3107) input 0 of each multiplexer is connected to the output of a corresponding multiplexer of the immediately prior layer.

Input 1 of each multiplexer of each layer is connected to another multiplexer output of the immediately prior than input 0. Input data (3101) sections 0 to 31 are connected to the second input (input 1) of respective layer L5 3102 multiplexers 32 to 63. Input data (3101) sections 32 to 63 are connected to input 1 of respective layer L5 3102 multiplexers 0 to 31.

The outputs of layer L5 3102 sections 0 through 15 are connected to the second input of respective layer L4 3103 multiplexers 16 through 31. Outputs of layer L5 3102 multiplexers 16 through 31 are connected to the second input of second layer multiplexers 0 through 15. Outputs of layer L5 3102 multiplexers 32 through 47 are connected to the second inputs of respective layer L4 3103 multiplexers 48 to 63. Outputs of layer L5 3102 multiplexers 48 through 63 are connected to the second inputs of respective layer L4 3103 multiplexers 32 to 47.

The outputs of layer L4 3103 sections 0 through 7 are connected to the second input of respective layer L3 3104 multiplexers 8 through 15. The outputs of layer L4 3103 sections 8 through 15 are connected to the second input of respective layer L3 3104 multiplexers 0 through 7. The outputs of layer L4 3103 sections 16 through 23 are connected to the second input of respective layer L3 3104 multiplexers 24 through 31. The outputs of layer L4 3103 sections 24 through 31 are connected to the second input of respective layer L3 3104 multiplexers 16 through 23. The outputs of layer L4 3103 sections 32 through 39 are connected to the second input of respective layer L3 3104 multiplexers 40 through 47. The outputs of layer L4 3103 sections 40 through 47 are connected to the second input of respective layer L3 3104 multiplexers 32 through 39. The outputs of layer L4 3103 sections 48 through 55 are connected to the second input of respective layer L3 3104 multiplexers 55 through 63. The outputs of layer L4 3103 sections 56 through 63 are connected to the second input of respective layer L3 3104 multiplexers 48 through 55.

The outputs of layer L3 3104 sections 0 through 3 are connected to the second input of respective layer L2 3105 multiplexers 4 through 7. The outputs of layer L3 3103 sections 4 through 7 are connected to the second input of respective layer L2 3105 multiplexers 0 through 3. The outputs of layer L3 3104 sections 8 through 11 are connected to the second input of respective layer L2 3105 multiplexers 12 through 15. The outputs of layer L3 3103 sections 12 through 15 are connected to the second input of respective layer L2 3105 multiplexers 8 through 11.

Layers L2, L1 and L0 are similarly formed. In general, the multiplexer supplying the second input of a multiplexer of the adjacent layer is given as follows. For the case of $\log_2(n)$ layers of n multiplexers; i is the i-th multiplexer numbered from 1 to n in a layer; j is the j-the layer numbered from 1 to $\log_2(n)$, where the first layer is nearest the output and the $\log_2(n)$ layer is nearest the input: for the input layer the second input receives data of an input section corresponding to:

if $(i)\mathrm{mod}_{(2^j)} \leq 2^{(j-1)}$, then the input section number is $i+2^{(j-1)}$, and if $(i)\mathrm{mod}_{(2^j)} > 2^{(j-1)}$, then the input section number is $i-2^{(j-1)}$.

For the output layer the second input of each multiplexer of receives data from the output of a multiplexer corresponding to:

if i is odd, then the source multiplexer number is i+1, and
if i is even, then the source multiplexer number is i−1.

For other layers the second input of each multiplexer of other layers receives data from the output of a multiplexer corresponding to:

if $(i)\mathrm{mod}_{(2^j)} \leq 2^{(j-1)}$, then the source multiplexer number is $i+2^{(j-1)}$, and if $(i)\mathrm{mod}_{(2^j)} > 2^{(j-1)}$, then the source multiplexer number is $i-2^{(j-1)}$.

As seen by inspection of FIG. 31, the second inputs of the multiplexers in the butterfly network all come from a multiplexer of the prior layer displaced by $2^{(j-1)}$. The multiplexers in a first half of a group of $2^j$ multiplexers, are displaced to a multiplexer having a higher number by $2^j$. The multiplexers in a second half of the group of $2^j$ multiplexers, are displaced to a multiplexer having a lower number by $2^j$. The modulo operation noted above $((i)\mathrm{mod}_{(2^j)})$ determines the group half and is used to set the addition (higher source multiplexer number) or subtraction (lower source multiplexer number). The output layer represents a special case where an even/odd determination is substituted for the modulo operation.

In accordance with the preferred embodiment, the vector data width of 512 bits is segmented into 64 sections of the minimum data width of 8 bits. Thus each 2×1 multiplexer in butterfly network 3100 is 8 bits wide.

The butterfly network illustrated in FIG. 31 or the inverse butterfly network illustrated in FIG. 35 is capable of making many data transformations. This presents a difficulty in controlling the multiplexers of the respective layers. Since many transformations are possible and in general each multiplexer may be separately controlled, there are a large number of possible control states of this network. In this invention a limited set of multiplexer control signals are allowed, which enables a similarly limited set of data transformations. This limited capability is offset by the reduced complexity of the multiplexor control circuits.

As an example, using the 64 bit butterfly network shown in FIG. 31 with data input of:

| 63  | 62  | ... | 33 | 32 | 31  | 30  | ... | 1   | 0   |
|-----|-----|-----|----|----|-----|-----|-----|-----|-----|
| d31 | d30 | ... | d1 | d0 | d63 | d62 | ... | d33 | d32 |

And a desired data output of:

| 63 | 62 | ... | 33  | 32  | 31  | 30  | ... | 1   | 0   |
|----|----|-----|-----|-----|-----|-----|-----|-----|-----|
| d0 | d1 | ... | d31 | d32 | d33 | d34 | ... | d62 | d63 |

This transformation involves two operations: rotate to the right by 32 sections; and reverse the vector. For this simple example the needed controls for the two operations can be made by inspection. To rotate by 32 sections, all the layer L5 3210 multiplexers are set to the second input (input 1) and all other multiplexers are set to the first input (input 0). This can be expressed as:

L5: 1
L4: 0
L3: 0
L2: 0
L1: 0
L0: 0

To reverse the sections, all the multiplexers are set to the second input (input 1). This can be expressed as:

L5: 1
L4: 1

L3: 1
L2: 1
L1: 1
L0: 1

Note that the multiplexer controls for all multiplexers in a given layer are the same. In accordance with this invention, the desired two transformations can be achieved by XORing the controls for each layer. Thus:

L5: 1 XOR 1=0
L4: 0 XOR 1=1
L3: 0 XOR 1=1
L3: 0 XOR 1=1
L2: 0 XOR 1=1
L1: 0 XOR 1=1
L0: 0 XOR 1=1

Applying the same control inputs L5 through L0 to the inverse butterfly shown in FIG. 35, with input 3501 being the output 3108 will yield an output 3502 equal to input 3102 of the butterfly network.

This invention is limited to transformations by the butterfly network of FIG. 31 and the inverse butterfly network of FIG. 35 where all multiplexers of a given layer are controlled the same. Table 7 shows examples of transformations and the corresponding multiplexer control signals for the butterfly network.

TABLE 7

| Multiplexer Control Signals | | | | | | |
|---|---|---|---|---|---|---|
| L5 | L4 | L3 | L2 | L1 | L0 | Transformation |
| 1 | 0 | 0 | 0 | 0 | 0 | 32 section rotate right |
| 1 | 1 | 1 | 1 | 1 | 1 | reverse vector |
| 0 | 0 | 0 | 0 | 0 | 1 | 1 section shuffle |
| 0 | 0 | 1 | 0 | 0 | 0 | 8 section swap |

Figure 32:
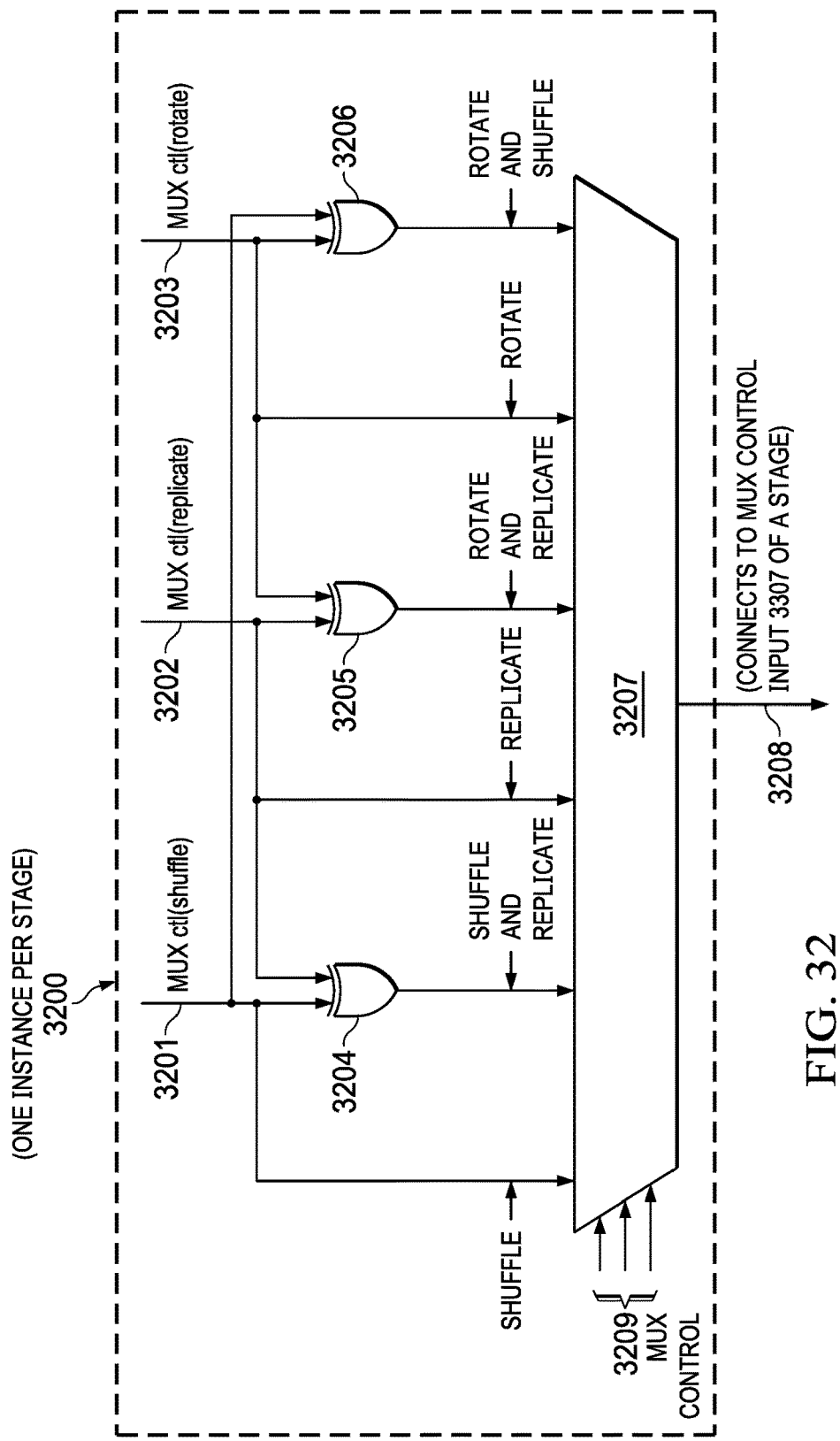
FIG. 32 illustrates part of the control logic for the butterfly network.

FIG. 32 shows an exemplary implementation of the combinatorial control logic of this invention. There is one combinatorial circuit 3200 for each layer of the butterfly network or inverse butterfly network. Input to combinatorial circuit 3200 includes precalculated pattern 3201 for shuffle, pattern 3202 for replicate and pattern 3203 for rotate. Table 7 shows examples of these patterns. Exclusive OR gate 3204 performs an exclusive OR function between shuffle 3201 and replicate 3202. Exclusive OR gate 3205 performs an exclusive OR function between replicate 3202 and rotate 3203. Exclusive OR gate 3206 performs an exclusive OR function between shuffle 3202 and rotate 3203. Multiplexer 3207 receives the precalculated shuffle 3201, replicate 3203 and rotate 3203 patterns as well as the outputs of XOR gates 3204, 3205 and 3206. Multiplexer 3207 selects one of these input signals for output at output 3208 corresponding to multiplexer control signals 3209. Multiplexer output 3208 is supplied to the control input of each multiplexer in the corresponding layer. According to a simplification of this invention, all multiplexers in a single layer receive the same control signal.

Figure 33:
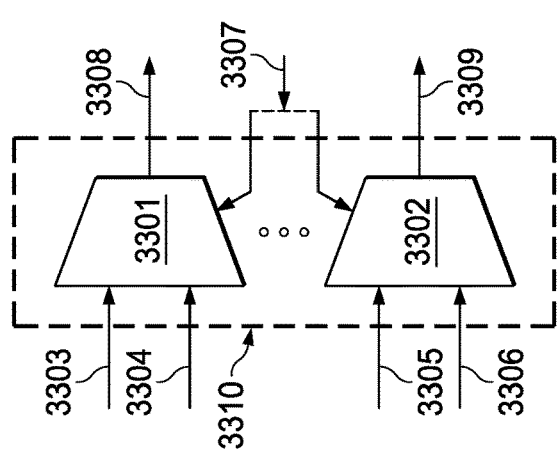
FIG. 33 illustrates one of the stages of the butterfly network.

FIG. 33 illustrates one layer 3310 of the butterfly network. FIG. 33 illustrates exemplary multiplexers 3301 and 3302. Multiplexer 3301 is the first 2×1 multiplexer of the layer and has first input 3303 and second input 3304. Multiplexer 3301 has an output 3308. Multiplexer 3301 receives control signal 3307 from the combinatorial circuit 3200 for that layer. In accordance with the butterfly network topography, output 3308 is supplied to input 0 of a corresponding multiplexer in an immediate next layer and to input 1 of another multiplexer of the immediate next layer. The pattern for this second multiplexer connection is illustrated in FIG. 31. Multiplexer 3302 is the nth 2×1 multiplexer of the layer having first input 3305 and second input 3306. Multiplexer 3302 has an output 3309. Multiplexer 3303 receives control signal 3307 from the combinatorial circuit 3200 for that layer. Output 3300 is supplied to inputs of two multiplexers in the immediate next layer as illustrated in FIG. 31. A 0 signal on control line 3907 selects respective first inputs (input 0) 3303 and 3305. A 1 signal on line 3307 selects respective second inputs (input 10 3304 and 3306. Inverse butterfly network of FIG. 35 employs the same topography within each layer as shown in FIG. 33, with the only difference being is the order of data flow.

Selection of control for butterfly network 3100 is as follows. Three precalculated patterns are selected, one each for shuffle, replicate and rotate. Each of these precalculated patterns is similar to the examples of Table 7. The XOR gates of the combinatorial circuit 3200 for each layer compute inputs to each multiplexer 3207 for the corresponding layers. Because one combinatorial circuit 3200 is provided for each layer, these computations can occur in parallel. Next is specification of multiplexer 3207 selection for each layer. This completes the multiplexer control specification. Because every 2×1 multiplexer in a layer receives the same control signal, this invention cannot enable all possible butterfly transformations. The inventive control scheme enables many useful butterfly transformations. The inventors believe trading reduction in control complexity for capability is advantageous.

A butterfly network or an inverse butterfly network can achieve most data re-arrangement required on load return data. The datapath is relatively simple and regular with a 2×1 MUX for each element in each stage. Since the load instruction and address alignment are available much earlier than load data from the memory, the controls can be calculated and stored in registers. This uses the latency of the load return pipeline to generate controls for the butterfly network and when the data is returned it just passes through a butterfly network with no additional timing overhead for controls. The butterfly and inverse butterfly network is also scalable in terms of the number of elements in the input and MUX levels. Prior art uses ad-hoc MUX networks which perform very specific data transformations and are not very scalable. Additional instructions to perform these transformations suggested in prior art also add unnecessary CPU cycles to accomplish the task.

Streaming engine 2800 attempts to fetch and format data ahead of central processing unit core 110's demand for it, so that it can maintain full throughput. Stream head registers 2818/2828 provide a small amount of buffering so that the process remains fully pipelined. Stream head registers 2818/2828 are not directly architecturally visible, except for the fact that streaming engine 2800 provides full throughput. Each stream also has a stream valid register 2819/2829. Valid registers 2819/2829 indicate which elements in the corresponding stream head registers 2818/2828 are valid.

The two streams 2810/2820 share a pair of independent L2 interfaces 2830: L2 Interface A (IFA) 2833 and L2 Interface B (IFB) 2834. Each L2 interface provides 512 bits/cycle throughput direct to the L2 controller for an aggregate bandwidth of 1024 bits/cycle. The L2 interfaces use the credit-based multicore bus architecture (MBA) protocol. The L2 controller assigns each interface its own pool of command credits. The pool should have sufficient credits so that each interface can send sufficient requests to achieve full read-return bandwidth when reading L2 RAM, L2 cache and multicore shared memory controller (MSMC) memory (described below).

To maximize performance, both streams can use both L2 interfaces, allowing a single stream to send a peak command rate of 2 requests/cycle. Each interface prefers one stream over the other, but this preference changes dynamically from request to request. IFA 2833 and IFB 2834 always prefer opposite streams, when IFA 2833 prefers Stream 0, IFB 2834 prefers Stream 1 and vice versa.

Arbiter 2831/2832 ahead of each interface 2833/2834 applies the following basic protocol on every cycle it has credits available. Arbiter 2831/2832 checks if the preferred stream has a command ready to send. If so, arbiter 2831/2832 chooses that command. Arbiter 2831/2832 next checks if an alternate stream has at least two requests ready to send, or one command and no credits. If so, arbiter 2831/2832 pulls a command from the alternate stream. If either interface issues a command, the notion of preferred and alternate streams swap for the next request. Using this simple algorithm, the two interfaces dispatch requests as quickly as possible while retaining fairness between the two streams. The first rule ensures that each stream can send a request on every cycle that has available credits. The second rule provides a mechanism for one stream to borrow the other's interface when the second interface is idle. The third rule spreads the bandwidth demand for each stream across both interfaces, ensuring neither interface becomes a bottleneck by itself.

Coarse Grain Rotator 2835/2836 enables streaming engine 2800 to support a transposed matrix addressing mode. In this mode, streaming engine 2800 interchanges the two innermost dimensions of its multidimensional loop. This accesses an array column-wise rather than row-wise. Rotator 2835/2836 is not architecturally visible, except as enabling this transposed access mode.

Figure 29:
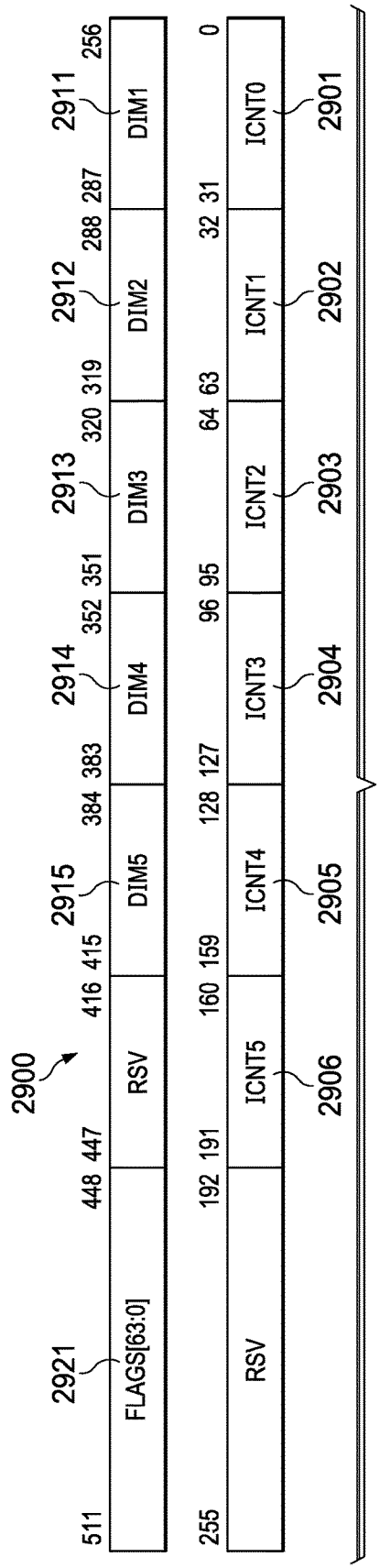
FIG. 29 illustrates a stream template register of this invention.

The stream definition template provides the full structure of a stream that contains data. The iteration counts and dimensions provide most of the structure, while the various flags provide the rest of the details. For all data-containing streams, the streaming engine defines a single stream template. All stream types it supports fit this template. The streaming engine defines a six-level loop nest for addressing elements within the stream. Most of the fields in the stream template map directly to the parameters in that algorithm. FIG. 29 illustrates stream template register 2900. The numbers above the fields are bit numbers within a 512-bit vector. Table 8 shows the stream field definitions of a stream template.

TABLE 8

| Field Name | FIG. 29 Reference Number | Description | Size Bits |
|---|---|---|---|
| ICNT0 | 2901 | Iteration count for loop 0 | 32 |
| ICNT1 | 2902 | Iteration count for loop 1 | 32 |
| ICNT2 | 2903 | Iteration count for loop 2 | 32 |
| ICNT3 | 2904 | Iteration count for loop 3 | 32 |
| ICNT4 | 2905 | Iteration count for loop 4 | 32 |
| INCT5 | 2906 | Iteration count for loop 5 | 32 |
| DIM1 | 2911 | Signed dimension for loop 1 | 32 |
| DIM2 | 2912 | Signed dimension for loop 2 | 32 |
| DIM3 | 2913 | Signed dimension for loop 3 | 32 |
| DIM4 | 2914 | Signed dimension for loop 4 | 32 |
| DIM5 | 2915 | Signed dimension for loop 5 | 32 |
| FLAGS | 2921 | Stream modifier flags | 64 |

Loop 0 is the innermost loop and loop 5 is the outermost loop. In the current example DIM0 is always equal to is ELEM_BYTES defining physically contiguous data. Thus the stream template register 2900 does not define DIM0. Streaming engine 2800 interprets all iteration counts as unsigned integers and all dimensions as unscaled signed integers. An iteration count at any level (ICNT0, ICNT1, ICNT2, ICNT3, ICNT4 or ICNT5) indicates an empty stream. Each iteration count must be at least 1 to define a valid stream. The template above fully specifies the type of elements, length and dimensions of the stream. The stream instructions separately specify a start address. This would typically be by specification of a scalar register in scalar register file 211 which stores this start address. This allows a program to open multiple streams using the same template but different registers storing the start address.

Figure 30:
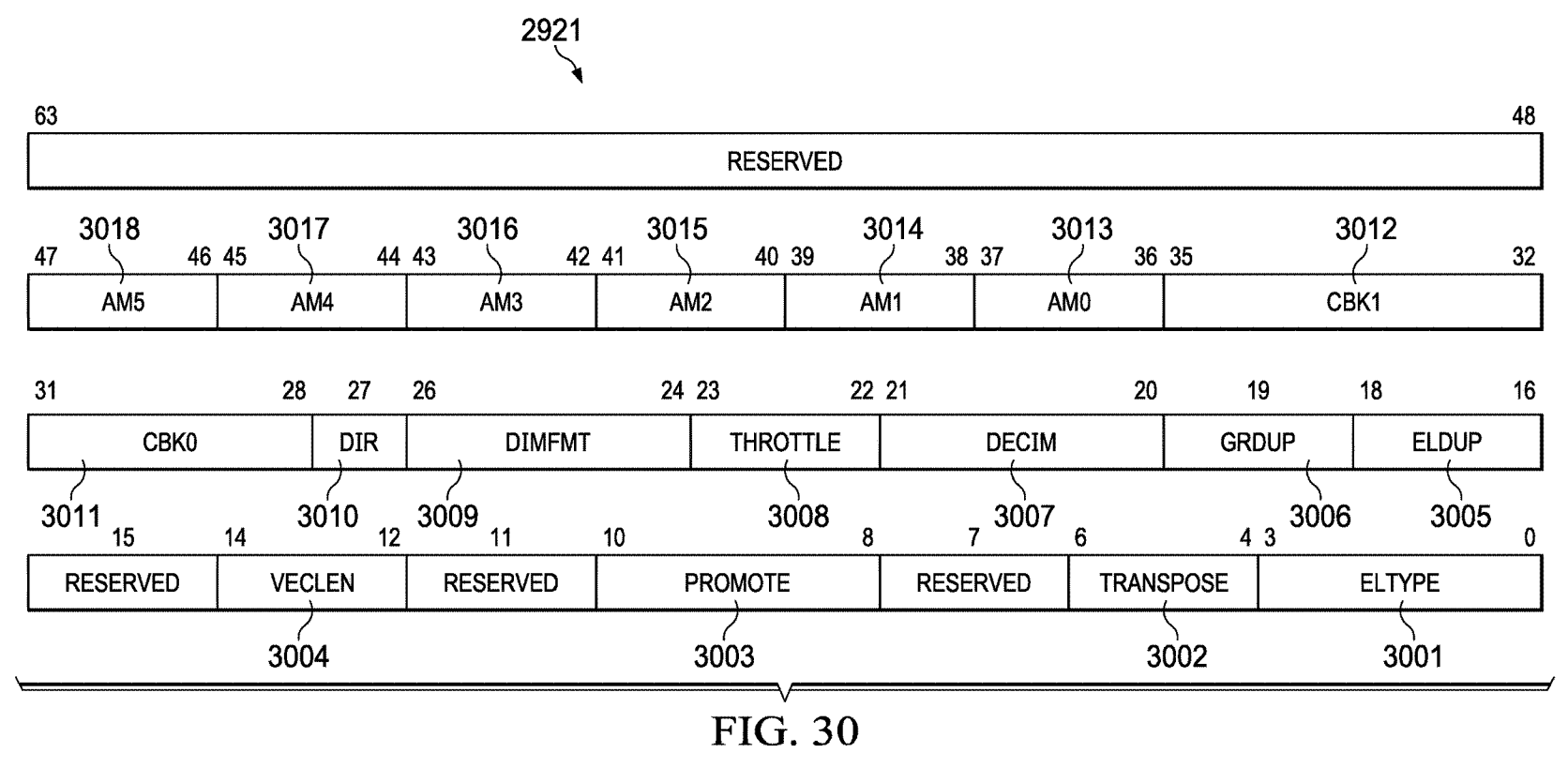

FIG. 30 illustrates sub-field definitions of the flags field 2921. As shown in FIG. 30 the flags field 2921 is 8 bytes or 64 bits. FIG. 30 shows bit numbers of the fields. Table 9 shows the definition of these fields.

TABLE 9

| Field Name | FIG. 30 Reference Number | Description | Size Bits |
|---|---|---|---|
| ELTYPE | 3001 | Type of data element | 4 |
| TRANSPOSE | 3002 | Two dimensional transpose mode | 3 |
| PROMOTE | 3003 | Promotion mode | 3 |
| VECLEN | 3004 | Stream vector length | 3 |
| ELDUP | 3005 | Element duplication | 3 |
| GRDUP | 3006 | Group duplication | 1 |
| DECIM | 3007 | Element decimation | 2 |
| THROTTLE | 3008 | Fetch ahead throttle mode | 2 |
| DIMFMT | 3009 | Stream dimensions format | 3 |
| DIR | 3010 | Stream direction 0 forward direction 1 reverse direction | 1 |
| CBK0 | 3011 | First circular block size number | 4 |
| CBK1 | 3012 | Second circular block size number | 4 |
| AM0 | 3013 | Addressing mode for loop 0 | 2 |
| AM1 | 3014 | Addressing mode for loop 1 | 2 |
| AM2 | 3015 | Addressing mode for loop 2 | 2 |
| AM3 | 3016 | Addressing mode for loop 3 | 2 |
| AM4 | 3017 | Addressing mode for loop 4 | 2 |
| AM5 | 3018 | Addressing mode for loop 5 | 2 |

The Element Type (ELTYPE) field 3001 defines the data type of the elements in the stream. The coding of the four bits of the ELTYPE field 3001 is defined as shown in Table 10.

TABLE 10

| ELTYPE | Real/Complex | Sub-element Size Bits | Total Element Size Bits |
|---|---|---|---|
| 0000 | real | 8 | 8 |
| 0001 | real | 16 | 16 |
| 0010 | real | 32 | 32 |
| 0011 | real | 64 | 64 |
| 0100 | reserved | | |
| 0101 | reserved | | |
| 0110 | reserved | | |
| 0111 | reserved | | |
| 1000 | complex no swap | 8 | 16 |
| 1001 | complex no swap | 16 | 32 |
| 1010 | complex no swap | 32 | 64 |
| 1011 | complex no swap | 64 | 128 |

TABLE 10-continued

| ELTYPE | Real/Complex | Sub-element Size Bits | Total Element Size Bits |
|---|---|---|---|
| 1100 | complex swapped | 8 | 16 |
| 1101 | complex swapped | 16 | 32 |
| 1110 | complex swapped | 32 | 64 |
| 1111 | complex swapped | 64 | 128 |

Real/Complex Type determines whether the streaming engine treats each element as a real number or two parts (real/imaginary or magnitude/angle) of a complex number. This field also specifies whether to swap the two parts of complex numbers. Complex types have a total element size that is twice their sub-element size. Otherwise, the sub-element size equals total element size.

Sub-Element Size determines the type for purposes of type promotion and vector lane width. For example, 16-bit sub-elements get promoted to 32-bit sub-elements or 64-bit sub-elements when a stream requests type promotion. The vector lane width matters when central processing unit core 110 operates in big endian mode, as it always lays out vectors in little endian order.

Total Element Size determines the minimal granularity of the stream. In the stream addressing model, it determines the number of bytes the stream fetches for each iteration of the innermost loop. Streams always read whole elements, either in increasing or decreasing order. Therefore, the innermost dimension of a stream spans ICNT0×total-element-size bytes. The TRANSPOSE field 3002 determines whether the streaming engine accesses the stream in a transposed order. The transposed order exchanges the inner two addressing levels. The TRANSPOSE field 3002 also indicated the granularity it transposes the stream. The coding of the three bits of the TRANSPOSE field 3002 is defined as shown in Table 11 for normal 2D operations.

TABLE 11

| Transpose | Meaning |
|---|---|
| 000 | Transpose disabled |
| 001 | Transpose on 8-bit boundaries |
| 010 | Transpose on 16-bit boundaries |
| 011 | Transpose on 32-bit boundaries |
| 100 | Transpose on 64-bit boundaries |
| 101 | Transpose on 128-bit boundaries |
| 110 | Transpose on 256-bit boundaries |
| 111 | Reserved |

Streaming engine 2800 may transpose data elements at a different granularity than the element size. This allows programs to fetch multiple columns of elements from each row. The transpose granularity must be no smaller than the element size. The TRANSPOSE field 3002 interacts with the DIMFMT field 3009 in a manner further described below.

The PROMOTE field 3003 controls whether the streaming engine promotes sub-elements in the stream and the type of promotion. When enabled, streaming engine 2800 promotes types by powers-of-2 sizes. The coding of the three bits of the PROMOTE field 3003 is defined as shown in Table 12.

TABLE 12

| PROMOTE | Promotion Factor | Promotion Type | Resulting Sub-element Size | | | |
|---|---|---|---|---|---|---|
| | | | 8-bit | 16-bit | 32-bit | 64-bit |
| 000 | 1x | N/A | 8-bit | 16-bit | 32-bit | 64-bit |
| 001 | 2x | zero extend | 16-bit | 32-bit | 64-bit | Invalid |
| 010 | 4x | zero extend | 32-bit | 64-bit | Invalid | Invalid |
| 011 | 8x | zero extend | 64-bit | Invalid | Invalid | Invalid |
| 100 | | reserved | | | | |
| 101 | 2x | sign extend | 16-bit | 32-bit | 64-bit | Invalid |
| 110 | 4x | sign extend | 32-bit | 64-bit | Invalid | Invalid |
| 111 | 8x | sign extend | 64-bit | Invalid | Invalid | Invalid |

When PROMOTE is 000, corresponding to a 1× promotion, each sub-element is unchanged and occupies a vector lane equal in width to the size specified by ELTYPE. When PROMOTE is 001, corresponding to a 2× promotion and zero extend, each sub-element is treated as an unsigned integer and zero extended to a vector lane twice the width specified by ELTYPE. A 2× promotion is invalid for an initial sub-element size of 64 bits. When PROMOTE is 010, corresponding to a 4× promotion and zero extend, each sub-element is treated as an unsigned integer and zero extended to a vector lane four times the width specified by ELTYPE. A 4× promotion is invalid for an initial sub-element size of 32 or 64 bits. When PROMOTE is 011, corresponding to an 8× promotion and zero extend, each sub-element is treated as an unsigned integer and zero extended to a vector lane eight times the width specified by ELTYPE. An 8× promotion is invalid for an initial sub-element size of 16, 32 or 64 bits. When PROMOTE is 101, corresponding to a 2× promotion and sign extend, each sub-element is treated as a signed integer and sign extended to a vector lane twice the width specified by ELTYPE. A 2× promotion is invalid for an initial sub-element size of 64 bits. When PROMOTE is 110, corresponding to a 4× promotion and sign extend, each sub-element is treated as a signed integer and sign extended to a vector lane four times the width specified by ELTYPE. A 4× promotion is invalid for an initial sub-element size of 32 or 64 bits. When PROMOTE is 111, corresponding to an 8× promotion and zero extend, each sub-element is treated as a signed integer and sign extended to a vector lane eight times the width specified by ELTYPE. An 8× promotion is invalid for an initial sub-element size of 16, 32 or 64 bits.

The VECLEN field 3004 defines the stream vector length for the stream in bytes. Streaming engine 2800 breaks the stream into groups of elements that are VECLEN bytes long. The coding of the three bits of the VECLEN field 3004 is defined as shown in Table 13.

TABLE 13

| VECLEN | Stream Vector Length |
|---|---|
| 000 | 1 byte |
| 001 | 2 bytes |
| 010 | 4 bytes |
| 011 | 8 bytes |
| 100 | 16 bytes |

TABLE 13-continued

| VECLEN | Stream Vector Length |
|---|---|
| 101 | 32 bytes |
| 110 | 64 bytes |
| 111 | Reserved |

VECLEN must be greater than or equal to the product of the element size in bytes and the duplication factor. As shown in Table 13, the maximum VECLEN of 64 bytes equals the preferred vector size of vector datapath side B 116. When VECLEN is shorter than the native vector width of central processing unit core 110, streaming engine 2800 pads the extra lanes in the vector provided to central processing unit core 110. The GRDUP field 3006 determines the type of padding. The VECLEN field 3004 interacts with ELDUP field 3005 and GRDUP field 3006 in a manner detailed below.

The ELDUP field 3005 specifies a number of times to duplicate each element. The element size multiplied with the element duplication amount must not exceed the 64 bytes. The coding of the three bits of the ELDUP field 3005 is defined as shown in Table 14.

TABLE 14

| ELDUP | Duplication Factor |
|---|---|
| 000 | No Duplication |
| 001 | 2 times |
| 010 | 4 times |
| 011 | 8 times |
| 100 | 16 times |
| 101 | 32 times |
| 110 | 64 times |
| 111 | Reserved |

The ELDUP field 3005 interacts with VECLEN field 3004 and GRDUP field 3006 in a manner detailed below. The nature of the relationship between the permitted element size, element duplication factor and destination vector length requires that a duplicated element that overflows the first destination register will fill an integer number of destination registers upon completion of duplication. The data of these additional destination registers eventually supplies the corresponding stream head register 2818/2828. Upon completion of duplication of a first data element, the next data element is rotated down to the least significant bits discarding the first data element. The process then repeats for this new data element.

The GRDUP bit 3006 determines whether group duplication is enabled. If GRDUP bit 3006 is 0, then group duplication is disabled. If the GRDUP bit 3006 is 1, then group duplication is enabled. When enabled by GRDUP bit 3006, streaming engine 2800 duplicates a group of elements to fill the vector width. VECLEN field 3004 defines the length of the group to replicate. When VECLEN field 3004 is less than the vector length of central processing unit core 110 and GRDUP bit 3006 enables group duplication, streaming engine 2800 fills the extra lanes (see FIGS. 21 and 22) with additional copies of the stream vector. Because stream vector length and vector length of central processing unit core 110 are always integral powers of two, group duplication always produces an integral number of duplicate copies. Note GRDUP and VECLEN do not specify the number of duplications. The number of duplications performed is based upon the ratio of VECLEN to the native vector length, which is 64 bytes/512 bits in the preferred embodiment.

The GRDUP field 3006 specifies how stream engine 2800 pads stream vectors for bits following the VECLEN length out to the vector length of central processing unit core 110. When GRDUP bit 3006 is 0, streaming engine 2800 fills the extra lanes with zeros and marks these extra vector lanes invalid. When GRDUP bit 3006 is 1, streaming engine 2800 fills extra lanes with copies of the group of elements in each stream vector. Setting GRDUP bit 3006 to 1 has no effect when VECLEN is set to the native vector width of central processing unit core 110. VECLEN must be at least as large as the product of ELEM_BYTES and the element duplication factor ELDUP. That is, an element or the duplication factor number of elements cannot be separated using VECLEN.

Group duplication operates only to the destination vector size. Group duplication does not change the data supplied when the product of the element size ELEM_BYTES and element duplication factor ELDUP equals or exceeds the destination vector width. Under these conditions the state of the GRDUP bit 3006 and the VECLEN field 3004 have no effect on the supplied data.

Element duplication (ELDUP) and group duplication (GRUDP) are independent Note these features include independent specification and parameter setting. Thus, element duplication and group duplication may be used together or separately. Because of how these are specified, element duplication permits overflow to the next vector while group duplication does not.

The DECIM field 3007 controls data element decimation of the corresponding stream. Streaming engine 2800 deletes data elements from the stream upon storage in stream head registers 2818/2828 for presentation to the requesting functional unit. Decimation always removes whole data elements, not sub-elements. The DECIM field 3007 is defined as listed in Table 15.

TABLE 15

| DECIM | Decimation Factor |
|---|---|
| 00 | No Decimation |
| 01 | 2 times |
| 10 | 4 times |
| 11 | Reserved |

If DECIM field 3007 equals 00, then no decimation occurs. The data elements are passed to the corresponding stream head registers 2818/2828 without change. If DECIM field 3007 equals 01, then 2:1 decimation occurs. Streaming engine 2800 removes odd number elements from the data stream upon storage in the stream head registers 2818/2828. Limitations in the formatting network require 2:1 decimation to be employed with data promotion by at least 2× (PROMOTE cannot be 000), ICNT0 must be multiple of 2 and the total vector length (VECLEN) must be large enough to hold a single promoted, duplicated element. For transposed streams (TRANSPOSE≠0), the transpose granule must be at least twice the element size in bytes before promotion. If DECIM field 3007 equals 10, then 4:1 decimation occurs. Streaming engine 2800 retains every fourth data element removing three elements from the data stream upon storage in the stream head registers 2818/2828. Limitations in the formatting network require 4:1 decimation to be employed with data promotion by at least 4× (PROMOTE cannot be 000, 001 or 101), ICNT0 must be multiple of 4 and the total vector length (VECLEN) must be large enough to hold a single promoted, duplicated element. For transposed streams (TRANSPOSE≠0), decimation always removes columns, and never removes rows. Thus, the transpose granule must be: at least twice the element size in bytes before promotion for 2:1 decimation (GRANULE≥2×ELEM_BYTES); and at least four times the element size in bytes before promotion for 4:1 decimation (GRANULE≥4× ELEM_BYTES).

The THROTTLE field 3008 controls how aggressively the streaming engine fetches ahead of central processing unit core 110. The coding of the two bits of this field is defined as shown in Table 16.

TABLE 16

| THROTTLE | Description |
|---|---|
| 00 | Minimum throttling, maximum fetch ahead |
| 01 | Less throttling, more fetch ahead |
| 10 | More throttling, less fetch ahead |
| 11 | Maximum throttling, minimum fetch ahead |

THROTTLE does not change the meaning of the stream, and serves only as a hint. The streaming engine may ignore this field. Programs should not rely on the specific throttle behavior for program correctness, because the architecture does not specify the precise throttle behavior. THROTTLE allows programmers to provide hints to the hardware about the program's own behavior. By default, the streaming engine attempts to get as far ahead of central processing unit core 110 as it can to hide as much latency as possible (equivalent THOTTLE=11), while providing full stream throughput to central processing unit core 110. While several key applications need this level of throughput, it can lead to bad system level behavior for others. For example, the streaming engine discards all fetched data across context switches. Therefore, aggressive fetch-ahead can lead to wasted bandwidth in a system with large numbers of context switches. Aggressive fetch-ahead only makes sense in those systems if central processing unit core 110 consumes data very quickly.

The DIMFMT field 3009 defines which of the loop count fields ICNT0 2901, ICNT1 2902, ICNT2 2903, ICNT3 2804, ICNT4 2905 and ICNT5 2906, of the loop dimension fields DIM1 2911, DIM2 2912, DIM3 2913, DIM4 2914 and DIM5 2915 and of the addressing mode fields AM0 3013, AM1 3014, AM2 3015, AM3 3016, AM4 3017 and AM5 3018 (part of FLAGS field 2921) of the stream template register 2900 that are active for that particular stream. Table 17 lists the active loops for various values of the DIMFMT field 3009.

TABLE 17

| DIMFMT | Loop5 | Loop4 | Loop3 | Loop2 | Loop1 | Loop0 |
|---|---|---|---|---|---|---|
| 000 | Inactive | Inactive | Inactive | Inactive | Inactive | Active |
| 001 | Inactive | Inactive | Inactive | Inactive | Active | Active |
| 010 | Inactive | Inactive | Inactive | Active | Active | Active |
| 011 | Inactive | Inactive | Active | Active | Active | Active |
| 100 | Inactive | Active | Active | Active | Active | Active |
| 101 | Active | Active | Active | Active | Active | Active |
| 110-111 | Reserved | | | | | |

Each active loop count must be at least 1. The outer active loop count must be greater than 1. (An outer active loop count of 1 is no different than corresponding a stream with one fewer loop.)

The DIR bit 3010 determines the direction of fetch of the inner loop (Loop0). If the DIR bit 3010 is 0 then Loop0 fetches are in the forward direction toward increasing addresses. If the DIR bit 3010 is 1 then Loop0 fetches are in the backward direction toward decreasing addresses. The fetch direction of other loops is determined by the sign of the corresponding loop dimension DIM1, DIM2, DIM3, DIM4 and DIM5 which are signed integers.

The CBK0 field 3011 and the CBK1 field 3012 control the circular block size upon selection of circular addressing. The manner of determining the circular block size will be more fully described below.

The AM0 field 3013, AM1 field 3014, AM2 field 3015, AM3 field 3016, AM4 field 3017 and AM5 field 3018 control the addressing mode of a corresponding loop. This permits the addressing mode to be independently specified for each loop. Each of AM0 field 3013, AM1 field 3014, AM2 field 3015, AM3 field 3016, AM4 field 3017 and AM5 field 3018 are three bits and are decoded as listed in Table 18.

TABLE 18

| AMx field | Meaning |
|---|---|
| 00 | Linear addressing |
| 01 | Circular addressing block size set by CBK0 |
| 10 | Circular addressing block size set by CBK0 + CBK1 + 1 |
| 11 | reserved |

In linear addressing the address advances according to the address arithmetic whether forward or reverse. In circular addressing the address remains within a defined address block. Upon reaching the end of the circular address block the address wraps around to other limit of the block. Circular addressing blocks are typically limited to $2^N$ addresses where N is an integer. Circular address arithmetic may operate by cutting the carry chain between bits and not allowing a selected number of most significant bits to change. Thus arithmetic beyond the end of the circular block changes only the least significant bits.

The block size is set as listed in Table 19.

TABLE 19

| Encoded Block Size CBK0 or CBK0 + CBK1 + 1 | Block Size (bytes) |
|---|---|
| 0 | 512 |
| 1 | 1K |
| 2 | 2K |
| 3 | 4K |
| 4 | 8K |
| 5 | 16K |
| 6 | 32K |
| 7 | 64K |
| 8 | 128K |
| 9 | 256K |
| 10 | 512K |
| 11 | 1M |
| 12 | 2M |
| 13 | 4M |
| 14 | 8M |
| 15 | 16M |
| 16 | 32M |
| 17 | 64M |
| 18 | 128M |
| 19 | 256M |
| 20 | 512M |
| 21 | 1 G |
| 22 | 2 G |
| 23 | 4 G |
| 24 | 8 G |
| 25 | 16 G |
| 26 | 32 G |

TABLE 19-continued

| Encoded Block Size CBK0 or CBK0 + CBK1 + 1 | Block Size (bytes) |
|---|---|
| 27 | 64 G |
| 28 | Reserved |
| 29 | Reserved |
| 30 | Reserved |
| 31 | Reserved |

In the preferred embodiment the circular block size is set by the number encoded by CBK0 (first circular address mode 01) or the number encoded by CBK0+CBK1+1 (second circular address mode 10). For example the first circular address mode, the circular address block size can be from 512 bytes to 16 M bytes. For the second circular address mode, the circular address block size can be from 1 K bytes to 64 G bytes. Thus the encoded block size is $2^{(B+9)}$ bytes, where B is the encoded block number which is CBK0 for the first block size (AMx of 01) and CBK0+CBK1+1 for the second block size (AMx of 10).

The central processing unit 110 exposes the streaming engine to programs through a small number of instructions and specialized registers. A STROPEN instruction opens a stream. The STROPEN command specifies a stream number indicating opening stream 0 or stream 1. The STROPEN command specifies a data register storing the start address of the stream. The STROPEN specifies a stream template register which stores the stream template as described above. The arguments of the STROPEN instruction are listed in Table 20.

TABLE 20

| Argument | Description |
|---|---|
| Stream Start Address Register | Scalar register storing stream start address |
| Steam Number | Stream 0 or Stream 1 |
| Stream Template Register | Vector register storing stream template data |

The stream start address register is preferably a register in general scalar register file 211. The STROPEN instruction may specify this stream start address register via scr1 field 1305. The STROPEN instruction specifies stream 0 or stream 1 by its opcode. The stream template register is preferably a vector register in general vector register file 221. The STROPEN instruction may specify this stream template register via scr2/cst field 1304. If the specified stream is active the STROPEN instruction closes the prior stream and replaces the stream with the specified stream.

A STRSAVE instruction captures sufficient state information of a specified stream to restart that stream in the future. A STRRSTR instruction restores a previously saved stream. A STRSAVE instruction does not save any of the data of the stream. A STRSAVE instruction saves only metadata. The stream re-fetches stream data in response to a STRRSTR instruction.

As noted above there are circumstances when some data within a stream head register 2818 or 2828 are not valid. As described above this could occur at the end of an inner loop when the number of stream elements is less than the stream head register 2818/2828 size. This could also occur at the end of an inner loop when the number of stream elements remaining is less than the lanes defined by VECLEN. For times not at the end of an inner loop, if VECLEN is less than the width of stream head register 2818/2828 and GRDUP is disabled, then lanes in stream head register 2818/2828 in excess of VECLEN are invalid.

Figure 34:
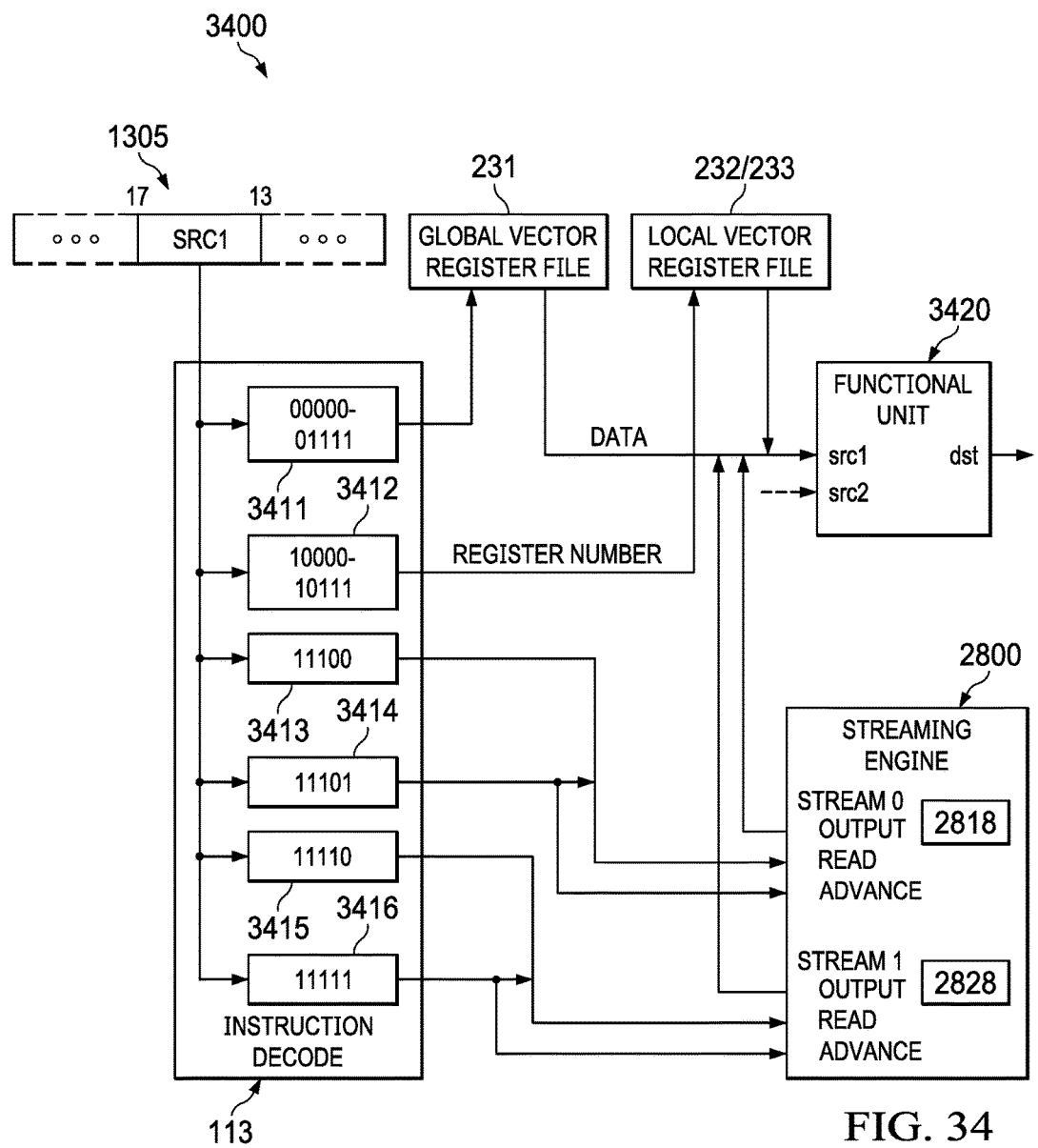
FIG. 34 is a partial schematic diagram of a streaming engine address generator illustrating generation of the loop address and loop count.

FIG. 34 is a partial schematic diagram 3400 illustrating the stream input operand coding described above. FIG. 34 illustrates decoding src1 field 1305 of one instruction of a corresponding src1 input of functional unit 3420. These same circuits may be duplicated for src2/cst field 1304 of an instruction controlling functional unit 3420. In addition, these circuits are duplicated for each instruction capable of employing stream data as an operand within an execute packet that can be dispatched simultaneously.

Instruction decoder 113 receives bits 13 to 17 comprising src1 field 1305 of an instruction. The opcode field opcode field (bits 4 to 12 for all instructions and additionally bits 28 to 31 for unconditional instructions) unambiguously specifies a corresponding functional unit 3420 and the function to be performed. In this embodiment, functional unit 3420 could be L2 unit 241, S2 unit 242, M2 unit 243, N2 unit 244 or C unit 245. The relevant part of instruction decoder 113 illustrated in FIG. 34 decodes src1 bit field 1305. Sub-decoder 3411 determines whether src1 bit field 1305 is in the range from 00000 to 01111. If this is the case, sub-decoder 3411 supplies a corresponding register number to global vector register file 231. In this example, this register number is the four least significant bits of src1 bit field 1305. Global vector register file 231 recalls data stored in the register corresponding to this register number and supplies this data to the src1 input of functional unit 4020. This decoding is generally known in the art.

Sub-decoder 3412 determines whether src1 bit field 1305 is in the range from 10000 to 10111. If this is the case, sub-decoder 3412 supplies a corresponding register number to the corresponding local vector register file. If the instruction is directed to L2 unit 241 or S2 unit 242, the corresponding local vector register file is local vector register file 232. If the instruction is directed to M2 unit 243, N2 unit 244 or C unit 245, the corresponding local vector register file is local vector register file 233. In this example, this register number is the three least significant bits of src1 bit field 1305. The corresponding local vector register file 232/233 recalls data stored in the register corresponding to this register number and supplies this data to the src1 input of functional unit 3420. This decoding is generally known in the art.

Sub-decoder 3413 determines whether src1 bit field 1305 is 11100. If this is the case, sub-decoder 3413 supplies a stream 0 read signal to streaming engine 2800. Streaming engine 2800 then supplies stream 0 data stored in stream head register 2818 to the src1 input of functional unit 3420.

Sub-decoder 3414 determines whether src1 bit field 1305 is 11101. If this is the case, sub-decoder 3414 supplies a stream 0 read signal to streaming engine 2800. Streaming engine 2800 then supplies stream 0 data stored in stream head register 2818 to the src1 input of functional unit 3420. Sub-decoder 3414 also supplies an advance signal to stream 0. As previously described, streaming engine 2800 advances to store the next sequential vector of data elements of stream 0 in stream head register 2818.

Sub-decoder 3415 determines whether src1 bit field 1305 is 11110. If this is the case, sub-decoder 3415 supplies a stream 1 read signal to streaming engine 2800. Streaming engine 2800 then supplies stream 1 data stored in stream head register 2828 to the src1 input of functional unit 3420.

Sub-decoder 3416 determines whether src1 bit field 1305 is 11111. If this is the case, sub-decoder 3416 supplies a stream 1 read signal to streaming engine 2800. Streaming engine 2800 then supplies stream 1 data stored in stream head register 2828 to the src1 input of functional unit 3420. Sub-decoder 3416 also supplies an advance signal to stream 1. As previously described, streaming engine 2800 advances to store the next sequential vector of data elements of stream 1 in stream head register 2828.

The exact number of instruction bits devoted to operand specification and the number of data registers and streams are design choices. Those skilled in the art would realize that other number selections than described in the application are feasible. In particular, the specification of a single global vector register file and omission of local vector register files is feasible. This invention employs a bit coding of an input operand selection field to designate a stream read and another bit coding to designate a stream read and advancing the stream.

This process illustrated in FIG. 34 automatically transfers valid data into predicate register file 234 each time stream data is read. This valid data may then be used by P unit 246 for further calculation of meta data. This valid data may also be used as a mask or as an operand for other operations by one or more of vector datapath side B 116 functional units including L2 unit 241, S2 unit 242, M2 unit 243, N2 unit 244 and C unit 245. There are numerous feasible compound logic operations employing this stream valid data.

What is claimed is:

1. A method of data transformation of an input data word of $2^N$ sections, where N is an integer, comprising the steps of:
    supplying said input data word to a set of N sequential layers of 2 to 1 multiplexers disposed from an input layer to an output layer, wherein: each multiplexer has a first input receiving data of a first corresponding multiplexer of a prior layer, a second input receiving data of a second different corresponding multiplexer of the prior layer, a control input and an output, each multiplexer providing an output corresponding to a selected one of said first input or said second input dependent upon a signal at said control input, each of the N sequential layers including $2^N$ 2 to 1 multiplexers;
    supplying a same control signal to each control input of each multiplexer of a layer; and
    outputting transformed data from said outputs of said multiplexers of said output layer.

2. The method of claim 1 wherein:
said step of supplying a same control signal to each control input of each multiplexer of a layer comprises the steps of:
    precalculating an N bit shuffle pattern,
    precalculating an N bit replicate pattern,
    precalculating an N bit rotate pattern, and
    supplying to said control input of each multiplexer of a layer a selected one of 1) a corresponding bit of said precalculated shuffle pattern, 2) a corresponding bit of said precalculated replicate pattern, 3) a corresponding bit of said rotate pattern, 4) an exclusive OR of said corresponding bit of said precalculated shuffle pattern and said corresponding bit of precalculated replicate pattern, 5) an exclusive OR of said corresponding bit of said precalculated shuffle pattern and said corresponding bit of precalculated rotate pattern, and 6) an exclusive OR of said corresponding bit of said precalculated replicate pattern and said corresponding bit of precalculated rotate pattern.

3. The method of claim 1, wherein:
said input data word consists of 64 sections; and
said N sequential layers consists of 6 layers.

4. The method of claim 1, wherein:
said input data word consists of 64 sections of 8 bits each section; and
said first input, said second input and said output of each of said 2 to 1 multiplixers consists of 8 bits.

5. The method of claim 1, wherein:
said set of N sequential layers of 2 to 1 multiplexers form a butterfly network.

6. The method of claim 1, wherein:
said set of N sequential layers of 2 to 1 multiplexers form an inverse butterfly network.

* * * * *